US012672501B2

(12) United States Patent
Park

(10) Patent No.: US 12,672,501 B2
(45) Date of Patent: Jun. 30, 2026

(54) APPARATUS AND METHOD OF TREATING SUBSTRATE

(71) Applicant: SEMES CO., LTD.,
Chungcheongnam-do (KR)

(72) Inventor: Joo Jib Park, Chungcheongnam-do (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 587 days.

(21) Appl. No.: 17/986,936

(22) Filed: Nov. 15, 2022

(65) Prior Publication Data

US 2023/0178387 A1 Jun. 8, 2023

(30) Foreign Application Priority Data

Dec. 7, 2021 (KR) ........................ 10-2021-0173828

(51) Int. Cl.
| | |
|---|---|
| *B08B 5/02* | (2006.01) |
| *B08B 1/12* | (2024.01) |
| *B08B 1/30* | (2024.01) |
| *B08B 5/04* | (2006.01) |
| *B08B 13/00* | (2006.01) |
| *H10P 72/00* | (2026.01) |
| *H10P 72/76* | (2026.01) |

(52) U.S. Cl.
CPC ............ *H10P 72/0402* (2026.01); *B08B 1/12* (2024.01); *B08B 1/30* (2024.01); *B08B 5/02* (2013.01); *B08B 5/04* (2013.01); *B08B 13/00* (2013.01); *H10P 72/0464* (2026.01); *H10P 72/0606* (2026.01); *H10P 72/7602* (2026.01)

(58) Field of Classification Search
CPC ......... H01L 21/67017; H01L 21/67034; H01L 21/67028; H01L 21/67051; H01L 21/6704; H01L 21/67766
USPC .......................................................... 15/301
See application file for complete search history.

(56) References Cited

U.S. PATENT DOCUMENTS

| | | | | |
|---|---|---|---|---|
| 2004/0144316 A1* | 7/2004 | Lee | ................... | H01L 21/67017 |
| | | | | 118/719 |
| 2012/0234364 A1* | 9/2012 | Muramoto | ........ | H01L 21/67766 |
| | | | | 134/104.1 |

(Continued)

FOREIGN PATENT DOCUMENTS

| | | |
|---|---|---|
| KR | 10-2007-0114959 A | 12/2007 |
| KR | 10-0869644 B1 | 11/2008 |
| KR | 10-2011-0077045 A | 7/2011 |

(Continued)

OTHER PUBLICATIONS

Translation of KR20110077045A (Year: 2011).*

(Continued)

*Primary Examiner* — Tom Rodgers
(74) *Attorney, Agent, or Firm* — Carter, DeLuca & Farrell LLP

(57) ABSTRACT

Provided is an apparatus for treating a substrate, the apparatus including: an index module; and a treating module disposed adjacent to the index module and treating a substrate, in which the treating module includes: one or a plurality of process chambers; a transfer chamber provided with a main transfer robot for transferring a substrate to the process chamber; and a cleaning unit for cleaning a hand of the main transfer robot.

13 Claims, 21 Drawing Sheets

(56) References Cited

U.S. PATENT DOCUMENTS

2019/0304819 A1*  10/2019  Woo ................. H01L 21/67778
2022/0403506 A1*  12/2022  Sadeghi ............ H01L 21/67161

FOREIGN PATENT DOCUMENTS

KR         20110077045 A  *  7/2011  ....... H01L 21/67051
KR       10-2013-0061709 A      6/2013
KR         10-1336077 B1    12/2013

OTHER PUBLICATIONS

Office Action dated Feb. 1, 2024 issued by the Korean Patent Office in corresponding KR Patent Application No. 10-2021-0173828, with English translation.

* cited by examiner

APPARATUS AND METHOD OF TREATING SUBSTRATE

CROSS-REFERENCE TO RELATED APPLICATIONS

This application claims priority to and the benefit of Korean Patent Application No. 10-2021-0173828 filed in the Korean Intellectual Property Office on Dec. 7, 2021, the entire contents of which are incorporated herein by reference.

TECHNICAL FIELD

The present invention relates to an apparatus and a method of treating a substrate, and more particularly, to an apparatus and a method of treating a substrate, in which a robot transferring a substrate inside the apparatus for treating a substrate is included.

BACKGROUND ART

In general, in a process of treating a glass substrate or a wafer in a process of manufacturing a flat panel display device or a semiconductor, various processes, such as a photoresist coating process, a developing process, an etching process, and an ashing process, are performed.

In each process, in order to remove various contaminants attached to the substrate, a wet cleaning process using a chemical solution or deionized water and a drying process for drying the chemical solution or the deionized water left on the surface of the substrate are performed. A general substrate treating apparatus has a transfer robot for unloading a substrate from a process chamber or loading a substrate into the process chamber. Since the transfer robot directly transfers the substrate before and after the process is in progress, high cleanliness needs to be maintained. However, in the process of cleaning a substrate, such as a mask or a wafer, in the process chamber, the lower surface of the substrate is not cleaned and dried compared to the upper surface of the substrate. In this case, the liquid component remaining on the lower surface of the substrate contaminates the hand of the transfer robot while the substrate is being transferred by the transfer robot. In addition, in some cases, the liquid component remaining on the upper surface of the substrate after the cleaning may travel down the edge surface of the substrate and contaminate the hand of the transfer robot.

In this case, the subsequent substrate is contaminated by contaminants remaining in the hand while the subsequent substrate is being transferred by the transfer robot.

SUMMARY OF THE INVENTION

The present invention has been made in an effort to provide a substrate treating apparatus and a robot cleaning method capable of preventing subsequent substrates from being contaminated due to a contaminated hand of a transfer robot.

The present invention has been made in an effort to provide a substrate treating apparatus and a robot cleaning method capable of maintaining a high degree of cleanliness in a hand of a transfer robot.

The object of the present invention is not limited thereto, and other objects not mentioned will be clearly understood by those of ordinary skill in the art from the following description.

An exemplary embodiment of the present invention provides an apparatus for treating a substrate, the apparatus including: an index module; and a treating module disposed adjacent to the index module and treating a substrate, in which the treating module includes: one or a plurality of process chambers; a transfer chamber provided with a main transfer robot for transferring a substrate to the process chamber; and a cleaning unit for cleaning a hand of the main transfer robot.

The cleaning unit may include: a housing; and a cleaning member disposed in the housing and cleaning the hand of the main transfer robot loaded into the housing.

In the exemplary embodiment, the cleaning member includes a purge nozzle for discharging purge gas to an upper surface of the hand of the main transfer robot loaded into the housing.

The cleaning unit may further include a liquid receiving plate disposed below the purge nozzle in the housing.

The cleaning unit may further include an exhaust member for exhausting an inside of the housing, and when viewed from the top, the exhaust member may be coupled to the housing at a position lower than the liquid receiving plate so as to overlap the liquid receiving plate.

The purge nozzle may have a plurality of discharge ports for discharging the purge gas in a downward direction, and the hand of the main transfer robot may include: a base plate; and a guide on which the substrate is placed and which is disposed so as to protrude from the base plate in an upper direction, and when the hand of the main transfer robot is loaded into and unloaded from the housing by forward and backward movement, a longitudinal direction of the purge nozzle may be provided in a direction perpendicular to the forward and backward movement direction of the hand when viewed from the top.

The base plate may include: a body; and a pair of fingers extending from the body, the guide may include: a first guide installed at a front end of each of the pair of fingers; and a second guide installed at a rear end of each of the pair of fingers; and the discharge port may include a plurality of first holes disposed in a first region opposite to the finger in a state in which the hand of the main transfer robot is loaded into the housing when viewed from above.

The discharge port may further include a plurality of second holes disposed in a second region opposite to a space between the fingers in a state in which the hand of the main transfer robot is loaded into the housing when viewed from above, and the first holes in the first region may be formed at a higher density than the second holes in the second region.

The cleaning member may further include an auxiliary nozzle provided with a plurality of discharge ports for discharging purge gas, and a longitudinal direction of the auxiliary nozzle may be provided in a vertical direction.

According to another exemplary embodiment, the cleaning member may include a suction member for sucking foreign substances or moisture from the hand of the main transfer robot.

According to another exemplary embodiment, the cleaning member may include a brush for wiping off foreign substances or moisture from the hand of the main transfer robot.

According to another exemplary embodiment, the cleaning member may include: a suction member for sucking foreign substances or moisture from the hand of the main transfer robot; and a purge nozzle for injecting purge gas toward the hand of the main transfer robot, and the suction member may suck foreign substances or moisture from the hand of the main transfer robot and then the purge nozzle injects purge gas toward the hand of the main transfer robot while the suction member and the purge nozzle move in a horizontal direction with respect to the hand.

The hand of the main transfer robot may include: a base plate; and a guide on which the substrate is placed and which is disposed so as to protrude from the base plate in an upper direction, and the cleaning member may be provided to clean the guide.

According to another exemplary embodiment, the cleaning member may include: a brush for wiping off foreign substances or moisture from the hand of the main transfer robot; and a purge nozzle for injecting purge gas toward the hand of the main transfer robot, and the brush may wipe off foreign substances or moisture from the hand of the main transfer robot and then the purge nozzle injects purge gas toward the hand of the main transfer robot while the brush and the purge nozzle move in a horizontal direction with respect to the hand.

The cleaning unit may further include: a support for supporting the cleaning member; a first driver for moving the support in a horizontal direction; a displacement sensor for measuring a distance between an upper surface of the hand and the cleaning member while the support is moved by the first driver; and a second driver for adjusting a height of the cleaning member during movement based on a measurement value obtained by the displacement sensor.

According to another exemplary embodiment, the cleaning member may include: a purge nozzle for injecting purge gas toward the hand of the main transfer robot; and a suction pipe for sucking foreign substances or moisture from the hand of the main transfer robot, and the suction pipe is disposed on one side with the main transfer robot interposed therebetween and the purge nozzle is disposed on the other side, so that the suction pipe and the purge nozzle are positioned to face each other.

According to an example, the cleaning unit may be installed adjacent to the transfer chamber.

According to another example, the cleaning unit may be positioned between the index module and the transfer chamber.

According to another example, the treating module may further include a buffer module disposed between the index module and the transfer chamber to temporarily store a substrate transferred between the index module and the transfer chamber, and the cleaning unit may be installed to be stacked with the buffer module.

Another exemplary embodiment of the present invention provides an apparatus for treating a substrate, the apparatus including: an index module; and a treating module disposed adjacent to the index module and treating a substrate, in which the treating module includes: one or a plurality of process chambers; a transfer chamber provided with a main transfer robot for transferring a substrate to the process chamber; a cleaning unit for cleaning the main transfer robot; and a buffer module disposed between the index module and the transfer chamber to temporarily store a substrate transferred between the index module and the transfer chamber, and a hand of the main transfer robot includes: a base plate; and a guide on which the substrate is placed and which is disposed so as to protrude from the base plate in an upper direction, and the cleaning unit is installed to be stacked with the buffer module, and include: a housing; and a cleaning member which is provided in the housing and cleans the hand of the main transfer robot, and the cleaning member is provided to clean foreign substances or moisture scattered from the guide of the hand of the main transfer robot.

Another exemplary embodiment of the present invention provides a method of treating a substrate, the method including: a transferring operation of transferring a substrate placed on the main transfer robot; and a cleaning operation of cleaning the main transfer robot with the cleaning unit in a state in which the substrate is removed from the main transfer robot.

Another exemplary embodiment of the present invention provides a method of treating a substrate, the method including: a transferring operation of transferring a substrate placed on the main transfer robot; and a cleaning operation of cleaning the main transfer robot with the cleaning unit in a state in which the substrate is removed from the main transfer robot, in which in the cleaning operation, in a state in which purge gas is injected from the purge nozzle, the hand of the main transfer robot is moved in a forward or backward direction to sequentially clean the first guide and the second guide.

According to the exemplary embodiment of the invention, it is possible to prevent the subsequent substrate from being contaminated due to the contaminated hand of the transfer robot.

Further, according to the exemplary embodiment of the invention, it is possible to maintain the hand of the transfer robot with a high degree of cleanliness.

The effect of the present invention is not limited to the foregoing effects, and non-mentioned effects will be clearly understood by those skilled in the art from the present specification and the accompanying drawings.

BRIEF DESCRIPTION OF THE DRAWINGS

FIG. 1 is a top plan view schematically illustrating a substrate treating facility provided with a substrate treating apparatus according to an exemplary embodiment of the present invention.

DETAILED DESCRIPTION

Figure 2:
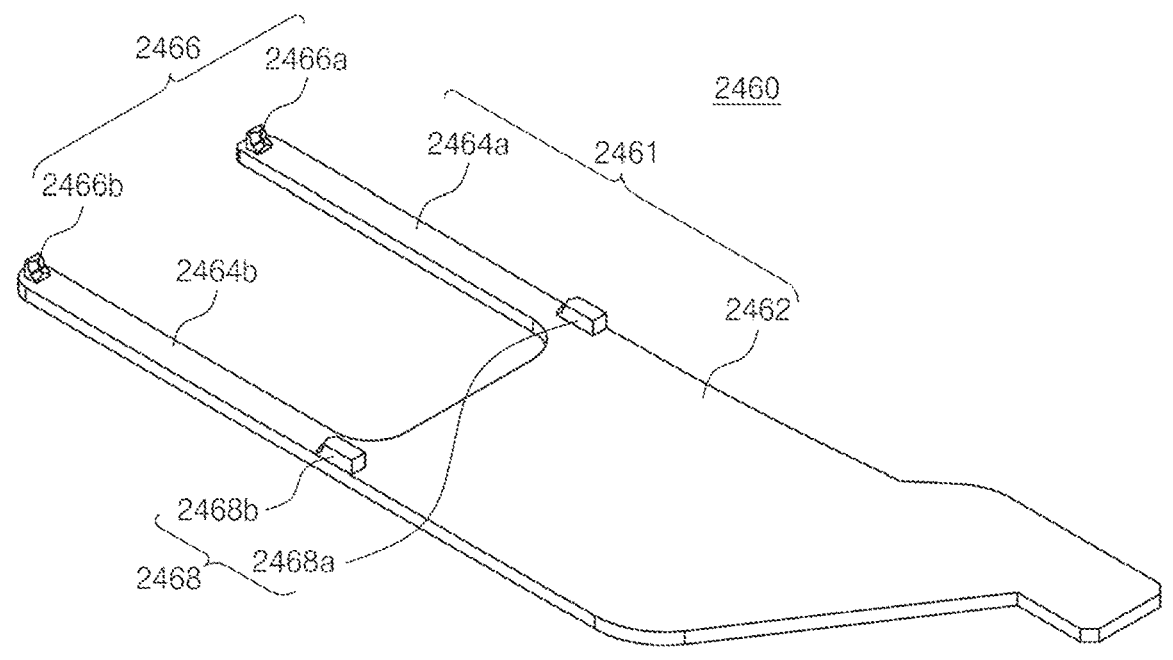
FIG. 2 is a perspective view illustrating a hand of a main transfer robot of FIG. 1.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Hereinafter, a square-shaped mask as a substrate will be described as an example. Alternatively, however, the substrate may be a circular plate, such as a wafer, or a rectangular panel used in manufacturing of flat panel displays.

Figure 1:
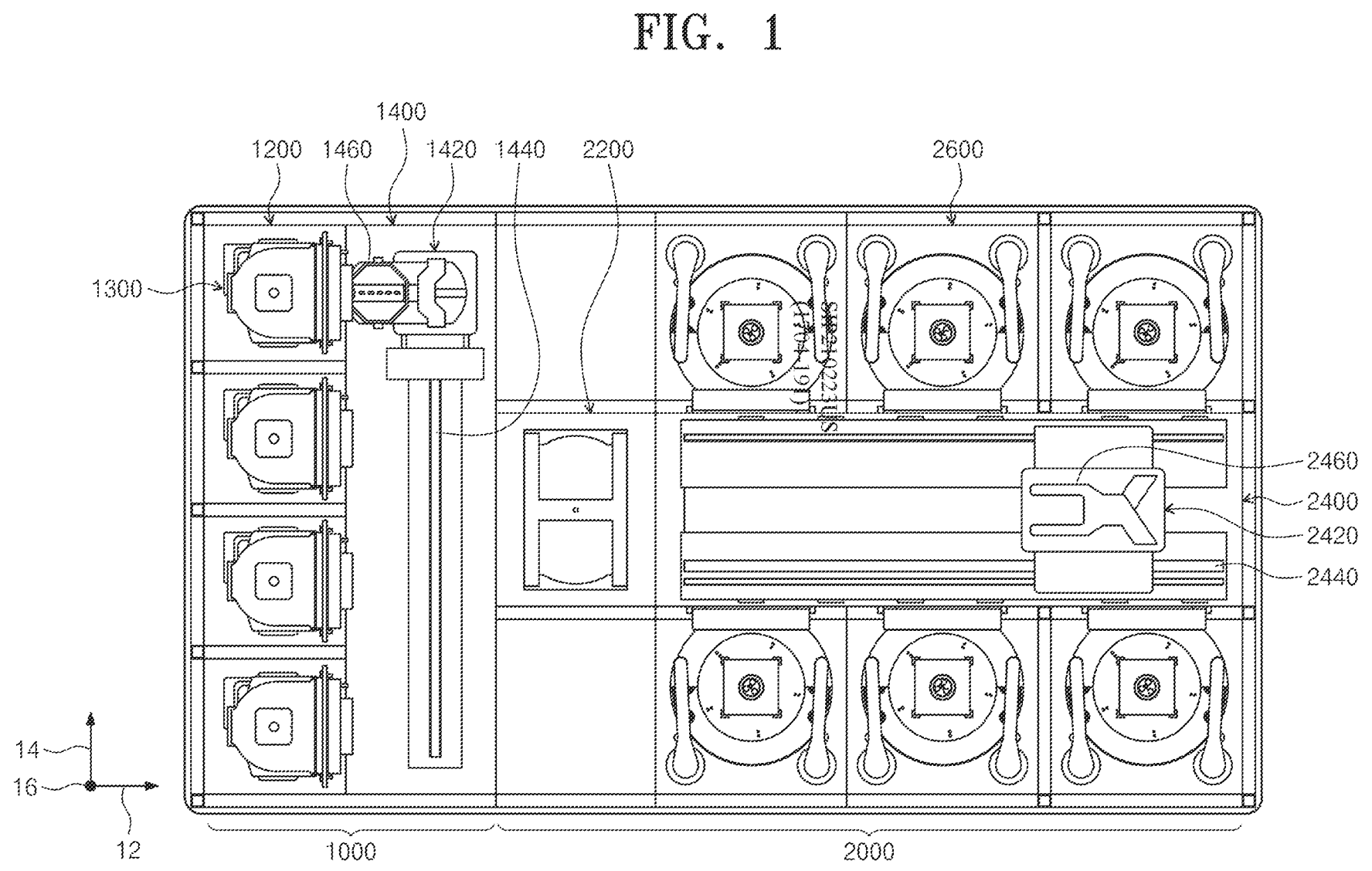

FIG. 1 is a top plan view schematically illustrating a substrate treating apparatus according to an exemplary embodiment of the present invention.

Referring to FIG. 1, the substrate treating apparatus includes an index module 1000 and a treating module 2000. According to the exemplary embodiment, the index module 1000 and the treating module 2000 are disposed along one direction. Hereinafter, the direction in which the index module 1000 and the treating module 2000 are disposed is referred to as a first direction 12, and when viewed from above, a direction vertical to the first direction 12 is referred to as a second direction 14, and a direction vertical to both the first direction 92 and the second direction 14 is referred to as a third direction 16.

The index module 1000 transfers the substrate from a vessel 1300 in which the substrate is accommodated to the treating module 2000, and accommodates the substrate that has been treated in the treating module 2000 into the vessel 1300. A longitudinal direction of the index module 1000 is provided in the second direction 14. The index module 1000 includes a load port 1200 and an index frame 1400. Based on the index frame 1400, the load port 1200 is located at a side opposite to the treating module 2000. The vessel 1300 in which the substrates are accommodated is placed on the load port 1200. The load port 1200 may be provided in plurality, and the plurality of load ports 1200 may be disposed in the second direction 14.

As the container 1300, an airtight container, such as a Front Open Unified Pod (FOUP), may be used. The vessel 1300 may be placed on the load port 22 by a transfer means (not illustrated), such as an overhead transfer, an overhead conveyor, or an automatic guided vehicle, or an operator.

An index robot 1420 is provided to the index frame 1400. A guide rail of which the longitudinal direction is provided in the second direction 14 may be provided in the index frame 1400, and the index robot 1420 may be provided to be movable on the guide rail 1440. The index robot 1420 includes a hand 1460 on which a substrate is placed, and the hand may be provided to be movable in the forward and backward direction, rotatable about the third direction 16, and movable along the third direction 16. The plurality of hands 1460 is provided while being spaced apart from each other in the vertical direction, and is capable of independently moving in a forward and backward direction.

The treating module 2000 includes a buffer module 2200, a transfer chamber 2400, a process chamber 2600, and a cleaning unit (not illustrated). The buffer module 2200 provides a space in which the substrate loaded into the treating module 2000 and the substrate unloaded from the treating module 2000 temporarily stay. The transfer chamber 2400 transfers a substrate between the buffer module 2200 and the process chamber 2600. The process chamber 2600 performs a process on the substrate. The cleaning unit cleans a hand 2460 of the main transfer robot 2420.

The transfer chamber 2400 may be provided so that a longitudinal direction thereof is the first direction 12. The transfer chamber 2400 has the main transfer robot 2420. A guide rail 2440 of which the longitudinal direction is provided in the first direction 12 is provided in the transfer chamber 2400, and the main transfer robot 2420 may be provided to be movable on the guide rail 2440. The main transfer robot 2420 includes the hand 2460 on which a substrate is placed, and the hand 2460 may be provided to be movable in the forward and backward direction, rotatable about the third direction 16, and movable along the third direction 16.

Figure 3:
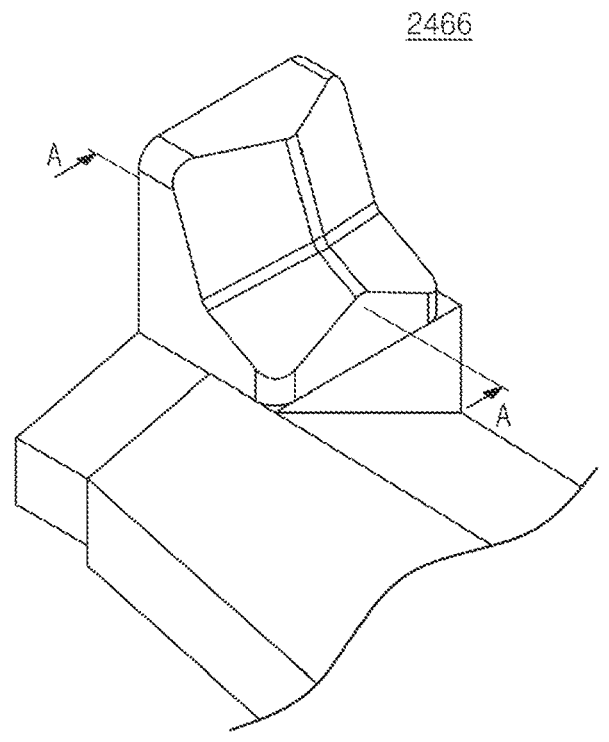
FIG. 3 is a perspective view illustrating first guides of a hand of the main transfer robot of FIG. 2.

FIG. 2 is a perspective view illustrating the hand 2460 of the main transfer robot 2420 of FIG. 1. FIG. 3 is a perspective view illustrating first guides 2466a and 2466b of the hand 2460 of the main transfer robot 2420 of FIG. 2. FIG.

Figure 5:
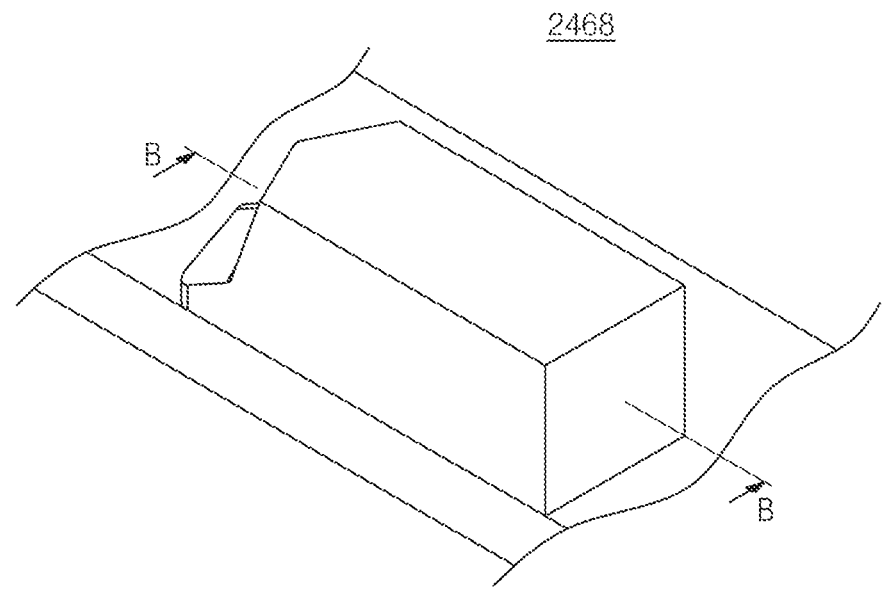
FIG. 5 is a perspective view illustrating second guides of the hand of the main transfer robot of FIG. 2.
Figure 6:
FIG. 6 is a cross-sectional view illustrating the second guides of the hand of the main transfer robot of FIG. 2.

4 is a cross-sectional view illustrating the first guides viewed in a direction A-A. FIG. 5 is a perspective view illustrating second guides 2468a and 2468b of the hand of the main transfer robot of FIG. 2. FIG. 6 is a cross-sectional view illustrating the second guides 2468a and 2468b viewed in a direction B-B.

Referring to FIGS. 2 to 6, the hand 2460 of the main transfer robot 2420 includes a base plate 2461 and guides 2466a, 2466b, 2468a, and 2468b.

The base plate 2461 includes a body 2462 and fingers 2464a and 2464b. The body 2462 may be configured in the shape of a quadrangular plate having a substantially flat top surface. The fingers 2464a and 2464b extend from a body 2462 at the front end of body 2462. Two fingers 2464a and 2464b are provided. Fingers 2464a and 2464b support the guides 2466a, 2466b, 2468a, and 2468b. The fingers 2464a and 2464b are disposed parallel to each other and are disposed while being spaced apart from each other. Unlike the above, the hand 2460 may be provided in various shapes.

The guides 2466a, 2466b, 2468a, and 2468b are installed on the fingers 2464a and 2464b. According to one example, the guides 2466a, 2466b, 2468a, and 2468b are provided at both ends of the fingers 2464a, 2464b, respectively. Accordingly, two guides 2466a and 2466b are installed on one finger 2644a and two guides 2468a and 2468b are installed on one finger 2464b. The hand 2460 may have four guides 2466a, 2466b, 2468a, and 2468b. The guides 2466a, 2466b, 2468a, and 2468b directly contact and support the substrate when the substrate is placed on the hand 2460 of the main transfer robot 2420. The guides 2466a, 2466b, 2468a, and 2468b are installed on the fingers 2464a and 2464b so as to protrude upward from the fingers 2464a and 2464b. The guides 2466a, 2466b, 2468a, and 2468b are positioned to support the four corners of the substrate, respectively. The guides installed at the front ends of the fingers 2464a and 2464b are referred to as first guides 2466a and 2466b, and the guides installed at the rear ends of the fingers 2464a and 2464b are referred to as second guides 2468a and 2468b.

Figure 4:
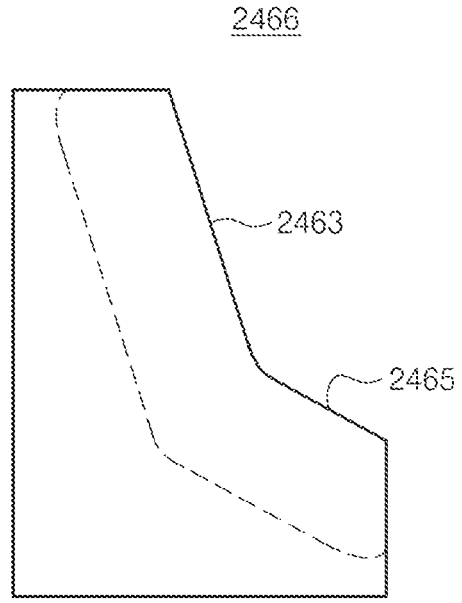
FIG. 4 is a cross-sectional view illustrating the first guides of the hand of the main transfer robot of FIG. 2.

Referring to FIGS. 3 and 4, the first guides 2466a and 2466b have a body. The body has an inner surface opposite to the substrate. The inner surface has an upper portion 2463 and a lower portion 2465. When the substrate is placed on the hand 2460, the substrate may be supported while being in contact with the hand at a portion where the upper portion 2463 and the lower portion 2465 meet. The upper portion 2463 has a first face and a second face. Based on the central axis of the upper portion 2463, the first face and the second face are inclined in a direction away from the base plate 2461 as the distances of the first face and the second face from the portion where the first face and the second face meet increase. The lower portion 2465 has a first face and a second face. Based on the central axis of the lower portion 2465, the first face and the second face are formed to be downward as the distances of the first face and the second face from the portion where the first face and the second face meet increase. The first and second faces of the upper portion 2463 and the first and second faces of the lower portion 2465 may all be provided to be flat.

Referring to FIGS. 5 and 6, the second guides 2468a and 2468b have a body. The inner surface of the body has the same or similar shape as the first guides 2466a and 2466b. The second guides 2468a and 2468b may be provided with a longer length than the first guides 2466a and 2466b.

The process chamber 2600 may be disposed on the side of the transfer chamber 2400. The process chamber 2600 and the transfer chamber 2400 may be disposed along the second direction 14. According to one example, the process chambers 2600 may be disposed on both sides of the transfer chamber 2400, and the process chambers 2600 may be provided in an arrangement of A×B (A and B are each 1 or a natural number greater than 1) along the first direction 12 and the third direction 16 on one side of the transfer chamber 2400. Unlike the above, the process chambers 2600 may be provided only on one side of the transfer chamber 2400, and the process chamber 2600 may be provided on one side and both sides of the transfer chamber 2400 as a single layer.

Figure 7:
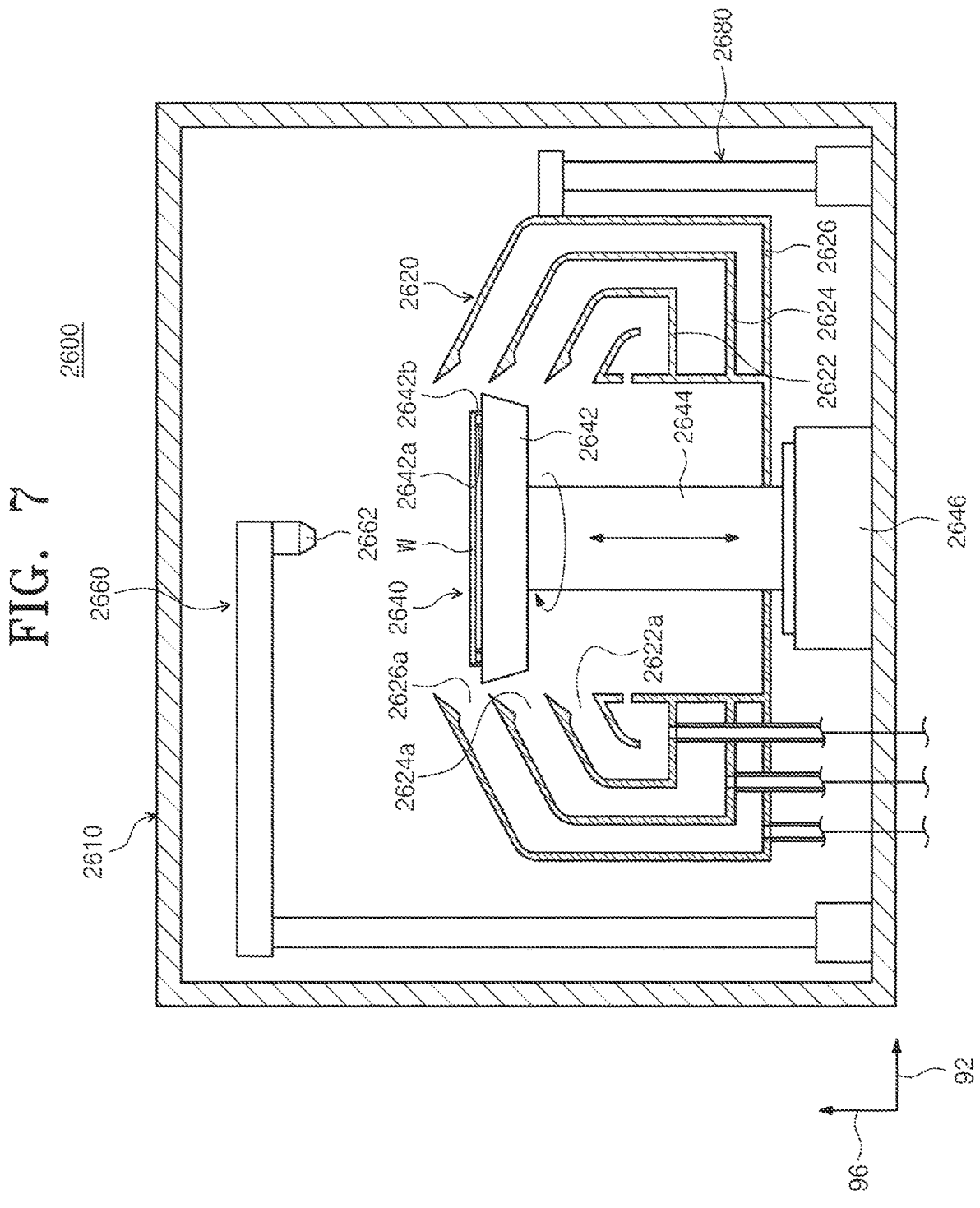
FIG. 7 is a cross-sectional view schematically illustrating a process chamber of FIG. 1.

FIG. 7 is a cross-sectional view schematically illustrating the process chamber 2600 of FIG. 1. Referring to FIG. 7, the process chamber 2600 includes a housing 2610, a cup 2620, a support unit 2640, a liquid supply unit 2660, and a lifting unit 2680. The housing 2610 is provided in a generally rectangular parallelepiped shape. The cup 2620, the support unit 2640, and the liquid supply unit 2660 are disposed in the housing 2610.

The cup 2620 has a processing space with an open top, and the substrate is liquid-treated in the processing space. The support unit 2640 supports the substrate in the processing space. The liquid supply unit 2660 supplies a liquid onto the substrate supported by the support unit 2640. The liquid may be provided in a plurality of types, and may be sequentially supplied onto the substrate. The lifting unit 2680 adjusts the relative height between the cup 2620 and the support unit 2640. According to the exemplary embodiment of the present invention, the cup 2620 has a plurality of recovery containers 2622, 2624, and 2626. Each of the recovery containers has a recovery space for recovering the liquid used for the substrate treatment. Each of the recovery containers 2622, 2624, and 2626 is provided in a ring shape surrounding the support unit. A treatment liquid scattered by the rotation of the substrate during the liquid treatment process is introduced into the recovery space through inlets 2622a, 2624a, and 2626a of the recovery containers 2622, 2624, and 2626. According to the exemplary embodiment, the cup 2620 includes a first recovery container 2622, a second recovery container 2624, and a third recovery container 2626. The first recovery container 2622 is disposed to surround the support unit 2640, the second recovery container 2624 is disposed to surround the first recovery container 2622, and the third recovery container 2626 is disposed to surround the second recovery container 2624. The second inlet 2624a for introducing the liquid into the second recovery container 2624 is disposed above the first inlet 2622a for introducing the liquid into the first recovery container 2622, and the third inlet 2626a for introducing the liquid into the third recovery container 2626 may be located above the second inlet 2624a.

The support unit 2640 has a support plate 2642 and a drive shaft 2644. The upper surface of the support plate 2642 may be provided in a generally circular shape and may have a larger diameter than the substrate. A support pin 2642a for supporting the rear surface of the substrate is provided in the central portion of the support plate 2642, and the support pin 2642a has an upper end protruding from the support plate 2642 so that the substrate is spaced a predetermined distance from the support plate 2642. A chuck pin 2642b is provided at an edge of the support plate 2642. The chuck pin 2642b is provided to protrude upward from the support plate 2642, and supports the side of the substrate so that the substrate is not separated from the support unit when the substrate is rotated. The drive shaft 2644 is driven by a driver 2646, is connected to the center of the bottom surface of the substrate, and rotates the support plate 2642 based on the central axis thereof. Unlike the above, when the substrate has a rectangular shape, such as a mask, the chuck pin 2642*b* may be additionally provided at each vertex of the substrate.

The liquid supply unit 2660 has a liquid supply nozzle 2662. The liquid supply nozzle 2662 supplies the treatment liquid onto the substrate. The treatment liquid may be a liquid that removes a film or foreign material remaining on the substrate.

The lifting unit 2680 moves the cup 2620 in the vertical direction. The relative height between the cup 2620 and the substrate is changed by the vertical movement of the cup 2620. Accordingly, since the recovery containers 2622, 2624, and 2626 for recovering the treatment liquid are changed according to the type of the liquid supplied to the substrate, the liquids may be separated and recovered. Unlike the above, the cup 2620 may be fixedly installed, and the lifting unit 2680 may move the support unit 2640 in the vertical direction.

Figure 8:
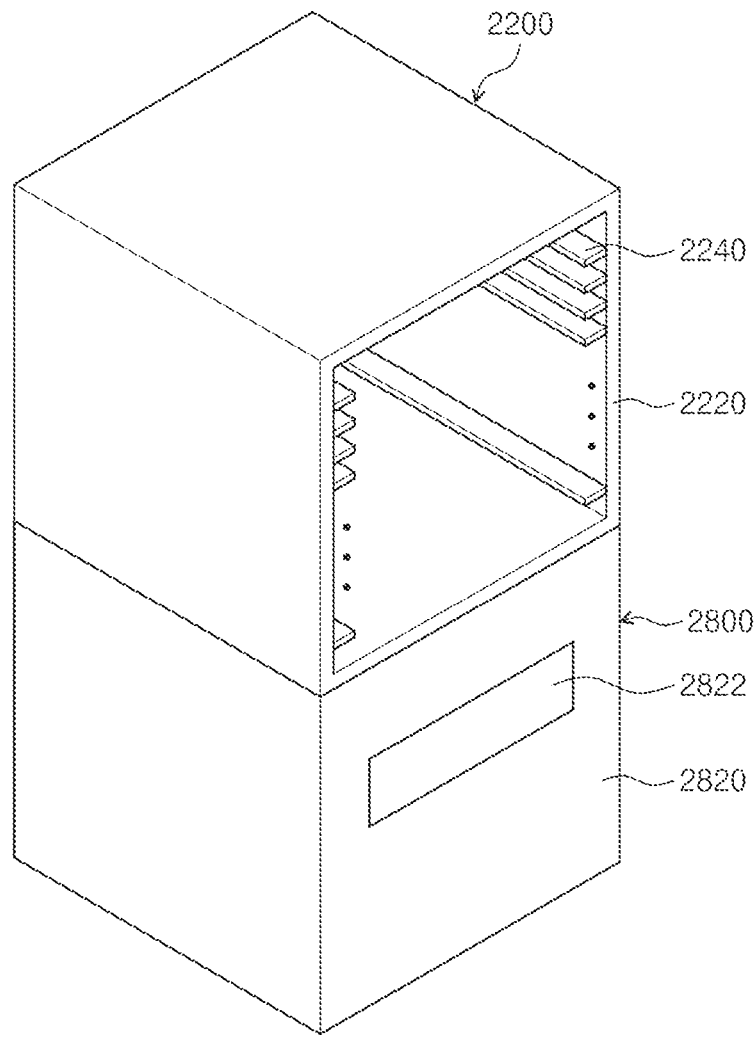
FIG. 8 is a cross-sectional view schematically illustrating a structure of a buffer module and a cleaning unit of FIG. 1.

FIG. 8 is a cross-sectional view schematically illustrating a structure of the buffer module 2200 and a cleaning unit 2800 of FIG. 1. Referring to FIG. 1, the buffer module 2200 is disposed between the index module 1000 and the transfer chamber 2400. Referring to FIG. 8, the buffer module 2200 includes a housing 2220 and a support 2240. The housing 2220 has a generally rectangular parallelepiped shape. The support 2240 is located within housing 2220. A plurality of supports 2240 is provided. The supports 2240 may be disposed to be spaced apart from each other in the third direction 16. A front face and a rear face of the housing 2220 are opened. The front face is a face facing the index module 1000, and the rear face is a face facing the transfer chamber 2400. The index robot 1420 may access the buffer module 2200 through the front face, and the main transfer robot 2420 may access the buffer module 2200 through the rear face. According to the example, the cleaning unit 2800 is disposed to be stacked with the buffer module 2200. The cleaning unit 2800 is disposed below the buffer module 2200. In this case, in the substrate treating apparatus, a downward airflow is provided by a fan filter unit (not illustrated) in the inner side of the buffer module 2200 and the space of the transfer chamber 2400. Accordingly, it is possible to prevent contaminants that may be generated when the cleaning unit 2800 cleans the hand 2460 from contaminating the substrate waiting in the buffer module 2200.

The cleaning unit 2800 includes a housing 2820, a cleaning member 2840, and an exhaust member 2860. The housing 2820 provides a space for cleaning the main transfer robot 2420. The housing 2820 may have a rectangular parallelepiped shape. An inlet 2822 through which the hand 2460 of the main transfer robot 2420 enters and exits is formed on one face in the side surface of the housing 2820 adjacent to the transfer chamber 2400. The inlet 2822 may be opened and closed by a door (not illustrated). The door may be opened when the hand 2460 is cleaned, and the door may be provided in a closed state while the hand 2460 is transferring the substrate. The cleaning member 2840 cleans the hand 2460 of the main transfer robot 2420.

The exhaust member 2860 exhausts the inside of the housing 2820. The exhaust member 2860 provides exhaust pressure to the housing 2820 when the main transfer robot 2420 is cleaned. The exhaust member 2860 includes an exhaust pipe and a decompressing member. Foreign substances or moisture inside the housing 2820 are discharged to the outside of the housing 2820 through an exhaust line. The decompressing member is installed in the exhaust pipe. The decompressing member may be a pump.

Figure 9:
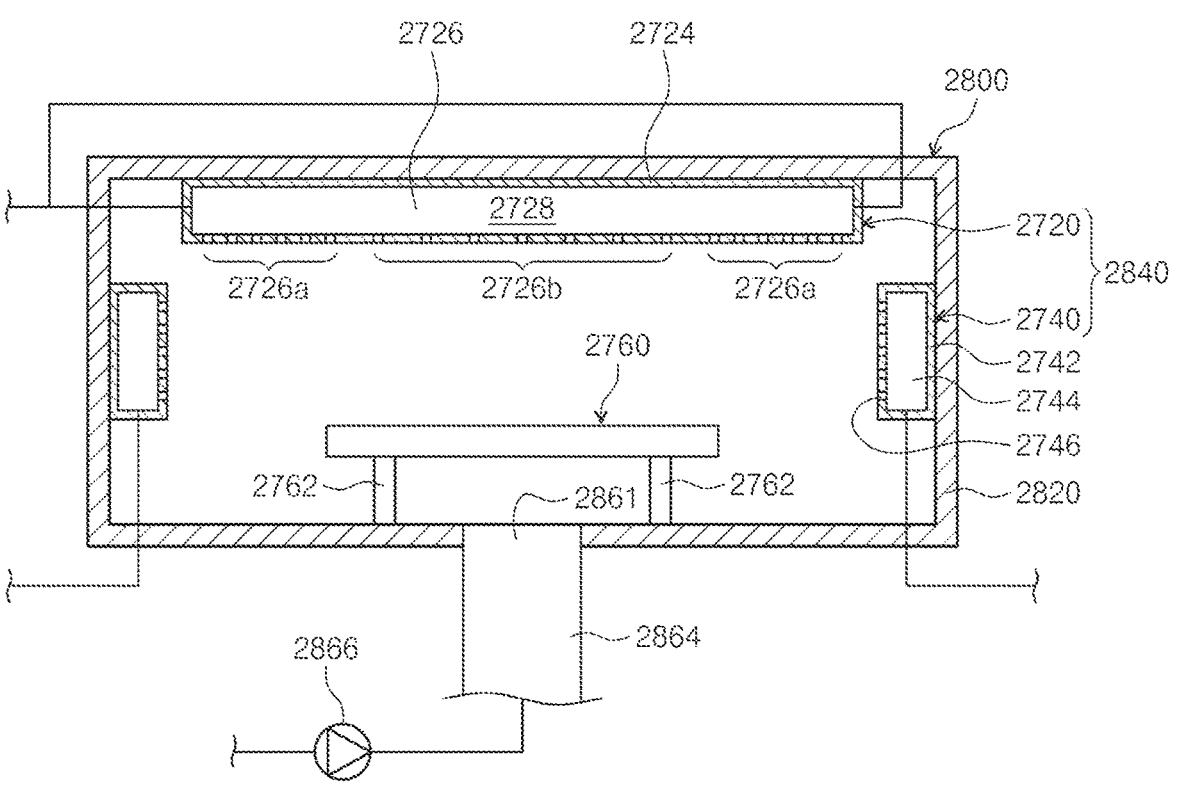
FIG. 9 is a cross-sectional view illustrating another exemplary embodiment of the cleaning member of FIG. 8.

FIG. 9 is a cross-sectional view illustrating an internal structure of the cleaning unit in which the exemplary embodiment of the cleaning member 2840 is illustrated. The cleaning member 2840 supplies purge gas to the hand 2460 of the main transfer robot 2420 loaded into the housing 2820 to remove the liquid remaining on the hand 2460 from the hand 2460. Regions from which the liquid is removed by the purge gas in the hand 2460 may be the guides 2466 and 2468. Optionally, the region from which the liquid is removed by the purge gas in the hand 2460 may include the fingers 2464*a* and 2464*b* on which the guides 2466 and 2468 are installed.

Referring to FIG. 9, the cleaning member 2840 includes a purge nozzle 2720 and an auxiliary nozzle 2740.

The purge nozzle 2720 is provided so that a longitudinal direction thereof is parallel to the direction in which the fingers 2464*a* and 2464*b* are spaced apart from each other. When the hand 2460 is placed under the purge nozzle 2720, the purge nozzle 2720 is provided with a length capable of supplying purge gas to the two fingers 2464*a* and 2464*b* simultaneously.

The purge nozzle 2720 has a body 2724 and a discharge port 2726. A passage 2728 through which purge gas flows is formed in the body 2724. The purge gas may be supplied to the passages 2728 of the body 2724 from both sides of the body 2724. A discharge port 2726 for discharging the purge gas in the passage 2728 in the down direction is formed on the bottom surface of the body 2724. A plurality of discharge ports 2726 is provided. The plurality of discharge ports 2726 may be arranged along the longitudinal direction of the body 2724. For example, the plurality of discharge ports 2726 may be arranged in a line along the longitudinal direction of the body 2724 or may be arranged in a plurality of columns.

According to an example, the plurality of discharge ports 2726 have first holes 2726 and second holes 2724. The first holes 2726 are formed in a first region of the body 2724. The second holes 2724 are formed in a second region of the body 2724. When the fingers 2464*a* and 2464*b* of the hand 2460 are disposed under the purge nozzle 2720, the first region is a region facing the fingers 2464*a* and 2464*b*, and the second region is a region facing the space between the fingers 2464*a* and 2464*b*. By discharging the purge gas from the first region, moisture remaining in the fingers 2464*a* and 2464*b* or the guides 2466 and 2468 may be effectively removed. In addition, by supplying the purge gas in the entire first region and the second region, foreign substances or moisture floating in the housing 2820 may be exhausted to the outside of the housing 2820 together with the purge gas.

According to the example, the first holes 2726 in the first region may be formed to have a higher density than the second holes 2724 in the second region. The diameters of the first hole 2726 and the second hole 2724 may be the same, and a gap between the adjacent first holes 2726 may be formed to be narrower than a gap between the adjacent second holes 2724. This is because when the fingers 2464*a* and 2464*b* or guides 2466 and 2468 are cleaned, a relatively large amount of purge gas is supplied to the fingers 2464*a* and 2464*b* or the guides 2466 and 2468, so that the water removal efficiency in the fingers 2464*a* and 2464*b* and the guides 2466 and 2468 may be further improved.

A longitudinal direction of the auxiliary nozzle 2740 is provided in the vertical direction. When the hand 2460 is loaded into the housing 2820, the lower end of the auxiliary nozzle 2740 is positioned lower than the hand 2460, and the upper end of the auxiliary nozzle 2740 is positioned higher than the hand 2460. The auxiliary nozzles 2740 may be disposed on both sides inside the housing 2820, respectively.

For example, when the hand 2460 is loaded into the housing 2820, the hand 2460 is positioned between the two auxiliary nozzles 2740. One of the auxiliary nozzles 2740 is positioned adjacent to one of the fingers 2464a and 2464b, and the other of the auxiliary nozzles 2740 is positioned adjacent to the other of the fingers 2464a and 2464b.

The auxiliary nozzle 2740 includes a body 2742 and a discharge port 2746. The body 2742 is formed with a passage 2744 inside which the purge gas flows. The purge gas may be supplied from one end of the body 2742 to the passage 2744 of the body 2742. Alternatively, the purge gas may be supplied from both ends of the body 2742 to the passages 2744 of the body 2742, respectively. The discharge port 2746 for discharging the purge gas in the passage 2744 toward the inner side of the housing 2820 is formed on a face in the side of the body 2742 facing the hand 2460. A plurality of discharge ports 2746 is provided. The plurality of discharge ports 2746 may be arranged along the longitudinal direction of the body 2742. For example, the plurality of discharge ports 2746 may be arranged in a line along the longitudinal direction of the body 2742 or may be arranged in a plurality of columns. The plurality of discharge ports 2746 may be disposed at the same interval from each other. Optionally, the discharge ports 2746 in a region facing the hand 2460 may be formed more densely than the discharge ports 2746 in other regions. The purge gas supplied from the auxiliary nozzle 2740 may remove the liquid remaining on the side surfaces of the fingers 2464a and 2464b or the side surfaces of the guides 2466 and 2468. In addition, the purge gas supplied from the auxiliary nozzle 2740 may concentrate the airflow in the housing 2820 in a direction toward the central portion.

An exhaust pipe 2864 may be coupled to the center of the bottom surface in the housing 2820. This may minimize the occurrence of vortexes in the housing 2820 when the purge gas is ejected from the purge nozzle 2720 or the auxiliary nozzle 2740. The decompressing member 2866 is mounted to the exhaust pipe 2864 outside the housing 2820.

A liquid receiving plate 2760 may be provided in the housing 2820. The liquid receiving plate 2760 is disposed at a lower position than the hand 2460 loaded into the housing 2820. In addition, the liquid receiving plate 2760 is positioned higher than the bottom surface of the housing 2820. The liquid receiving plate 2760 may be spaced apart from the bottom surface of the housing 2820 by a plurality of support rods 2762. When viewed from the top, the liquid receiving plate 2760 is positioned to cover the exhaust port 2861 of the exhaust pipe 2864. The liquid receiving plate 2760 may be provided in the shape of a plate having flat top and bottom surfaces. The liquid receiving plate 2760 prevents the liquid falling from the hand 2460 from flowing into the exhaust port 2862 in the process of cleaning the hand 2460.

Figure 10:
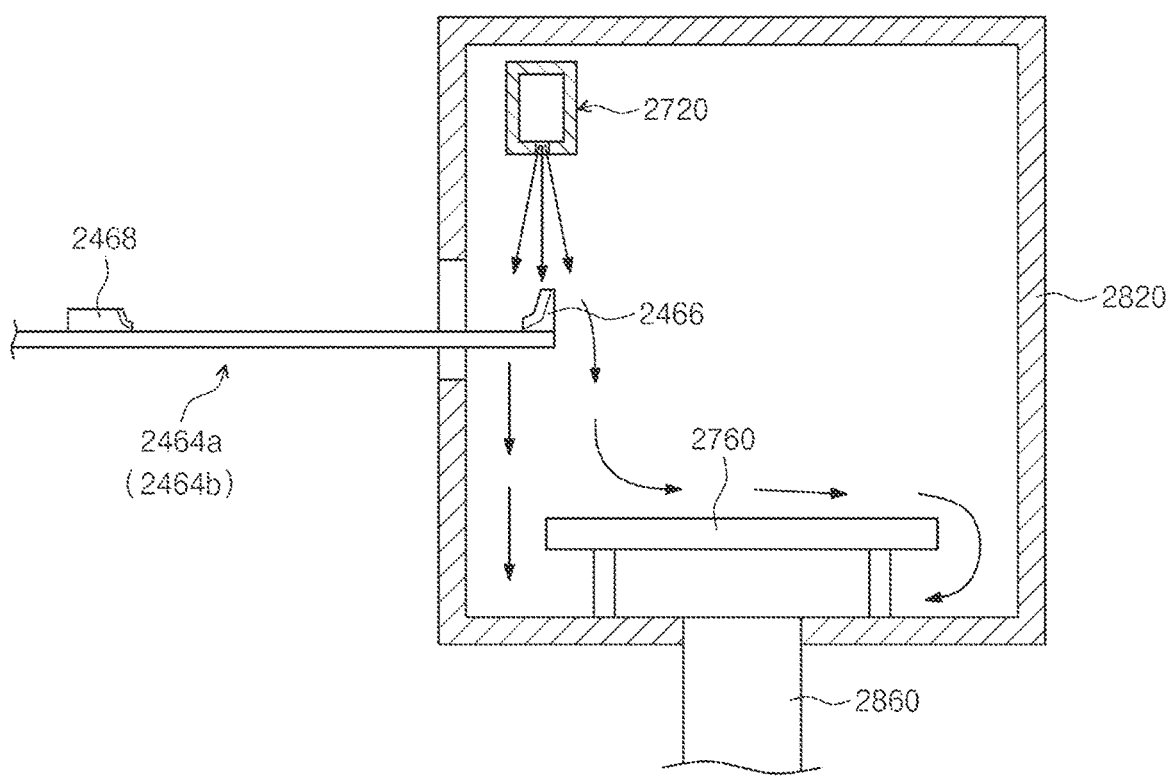
FIGS. 10 to 12 are diagrams sequentially illustrating a process of cleaning the hand of the main transfer robot by using the cleaning unit of FIG. 9.
Figure 11:
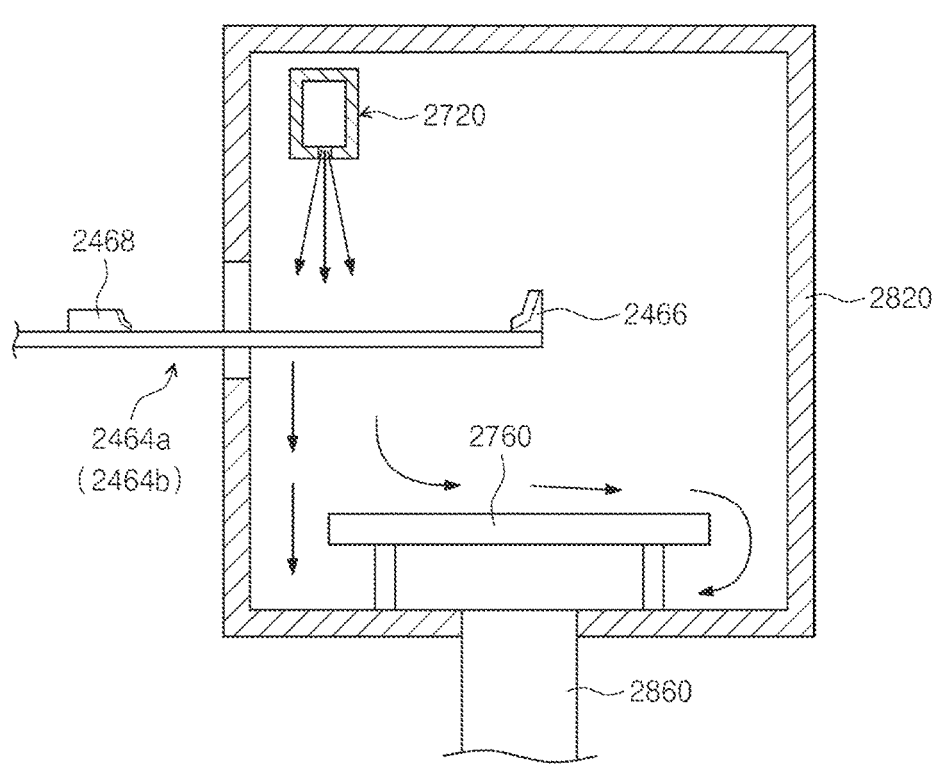
Figure 12:
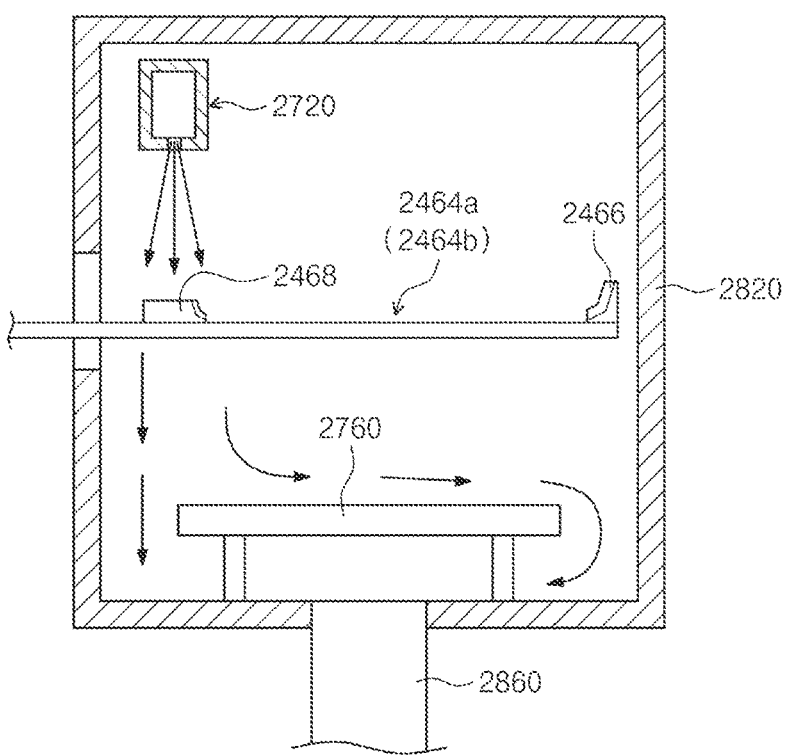

FIGS. 10 to 12 are diagrams sequentially illustrating a process of cleaning the hand 2460 of the main transfer robot 2420 by using the cleaning unit of FIG. 9. In FIGS. 10 to 12, the auxiliary nozzle is omitted.

As illustrated in FIG. 10, the purge gas is discharged from the purge nozzle 2720 and the auxiliary nozzle 2740 before the hand 2460 is loaded into the housing 2820. As the hand 2460 moves forward, the first guides 2466 and 2468 enter a position vertically below the purge nozzle 2720. The purge gas discharged from the purge nozzle 2720 reaches the upper surfaces of the first guides 2466 and 2468 and removes the liquid remaining on the upper surfaces of the first guides 2466 and 2468. As the hand 2460 continues to move forward, as illustrated in FIG. 11, the purge gas is directly supplied to the upper surfaces of the fingers 2464a and 2464b located between the first guides 2466 and 2468 and the second guides 2466 and 2468 to remove the liquid. As the hand 2460 continues to move forward, as illustrated in FIG. 12, the second guides 2466 and 2468 enter the position vertically below the purge nozzle 2720. The purge gas discharged from the purge nozzle 2720 reaches the upper surfaces of the second guides 2466 and 2468 and removes the liquid remaining on the upper surfaces of the second guides 2466 and 2468. The hand 2460 may repeat forward and backward movements so that the first guides 2466 and 2468 and the second guides 2466 and 2468 may be repeatedly cleaned by the purge gas. During the cleaning process, the liquid dripping from the fingers 2464a and 2464b and the guides 2466 and 2468 falls onto the upper surface of the liquid receiving plate 2760. Further, the airflow in the housing 2820 is exhausted to the outside through the exhaust pipe 2864 under the liquid receiving plate 2760.

Figure 13:
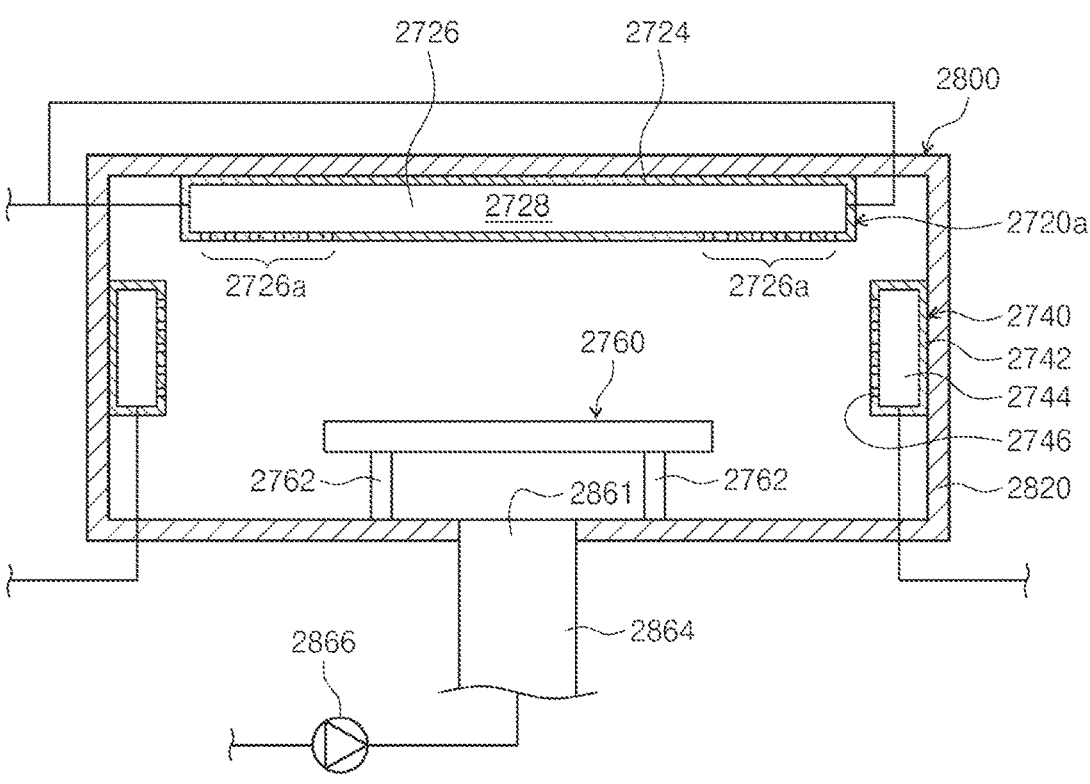
FIGS. 13 to 15 are cross-sectional views schematically illustrating modified examples of the cleaning unit of FIG. 9, respectively.
Figure 14:
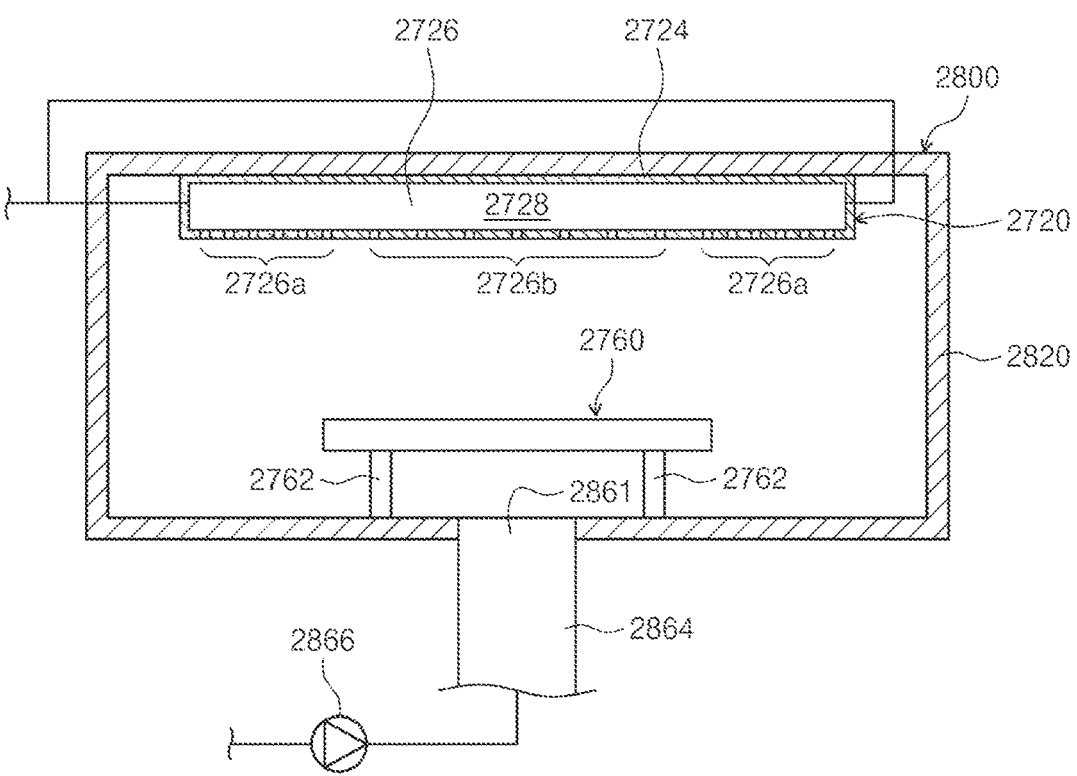
Figure 15:
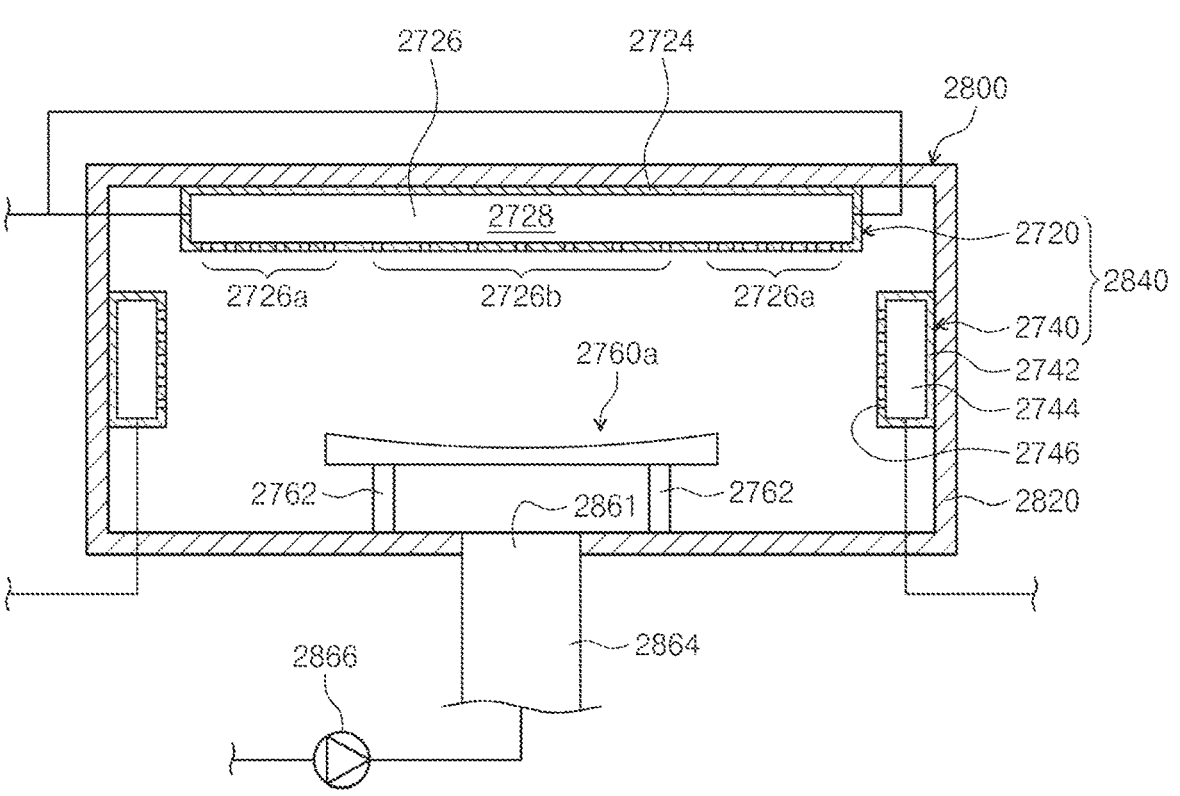

FIGS. 13 to 15 are cross-sectional views schematically illustrating modified examples of the cleaning unit of FIG. 9, respectively.

As illustrated in FIG. 13, in the purge nozzle 2720a, discharge holes 2826a may be provided only in the first region among the first region and the second region. This may further improve liquid removal efficiency by concentrating the purge gas discharged from the purge nozzle 2720 to the fingers 2464a and 2464b or the guides 2466 and 2468.

Also, as illustrated in FIG. 14, the cleaning member 2840 may include only the purge nozzle 2720 between the purge nozzle 2720 and the auxiliary nozzle 2740.

In addition, as illustrated in FIG. 15, the upper surface of the liquid receiving plate 2760a may be provided in a concave shape. This may stably hold the liquid on the liquid receiving plate 2760 when a large amount of liquid drips from the fingers 2464a and 2464b or the guides 2466 and 2468.

Figure 16:
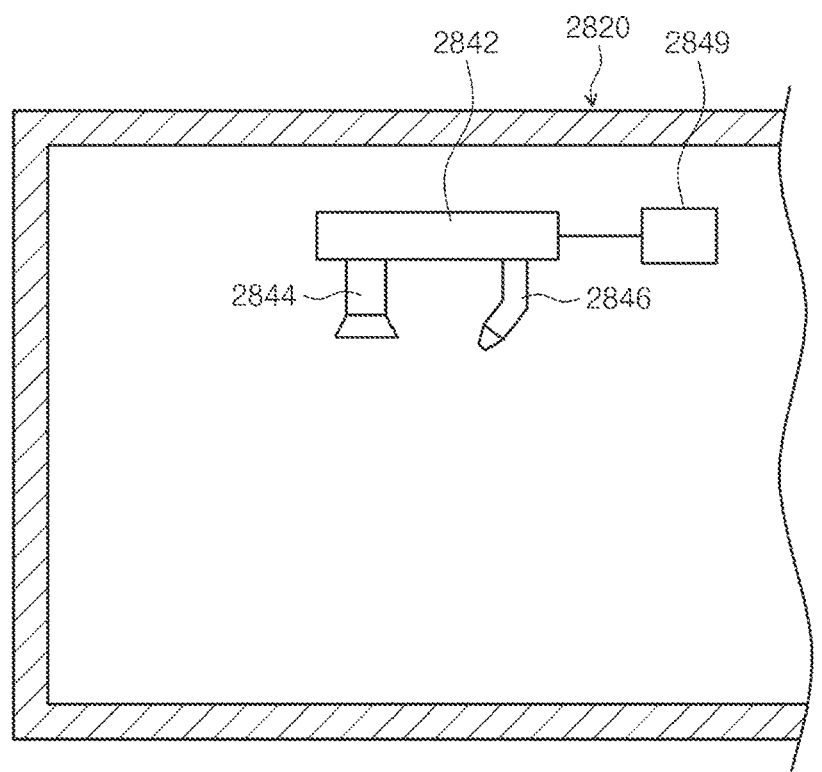
FIG. 16 is a cross-sectional view illustrating another exemplary embodiment of the cleaning member of FIG. 8.

FIG. 16 is a cross-sectional view illustrating another exemplary embodiment of the cleaning member 2840 of FIG. 8. Referring to FIG. 16, the cleaning member 2840 includes a support 2842, a suction member 2844, a purge nozzle 2846, and a first driver 2849.

The support 2842 supports the suction member 2844 and the purge nozzle 2846. The support 2842 is provided so that a longitudinal direction thereof is parallel to the ground. The support 2842 may be provided in a bar shape. The support 2842 is connected to the first driver 2849.

The suction member 2844 sucks foreign substances or moisture in the hand 2460 of the main transfer robot 2420. The suction member 2844 is provided in the form of an annular tube, and is installed on the support 2842. The suction member 2844 is disposed such that a suction port thereof faces the hand 2460 of the main transfer robot 2420 loaded into the housing 2820.

The purge nozzle 2846 injects the purge gas toward the hand 2460 of the main transfer robot 2420. The purge nozzle 2846 is installed on the support 2842. An upper portion of the purge nozzle 2846 is provided perpendicular to the ground, and a lower portion of the purge nozzle 2846 is inclined toward the guides 2466a, 2466b, 2468a, and 2468b of the main transfer robot 2420. A supply line for supplying purge gas to the purge nozzle 2846 may be formed in the support 2842.

The first driver 2849 moves the support 2842 in a direction parallel to the hand loaded into the housing 2820. The support 2842 may be moved along the fingers 2464a and 2464b of the hand 2460 of the main transfer robot 2420.

Figure 17:
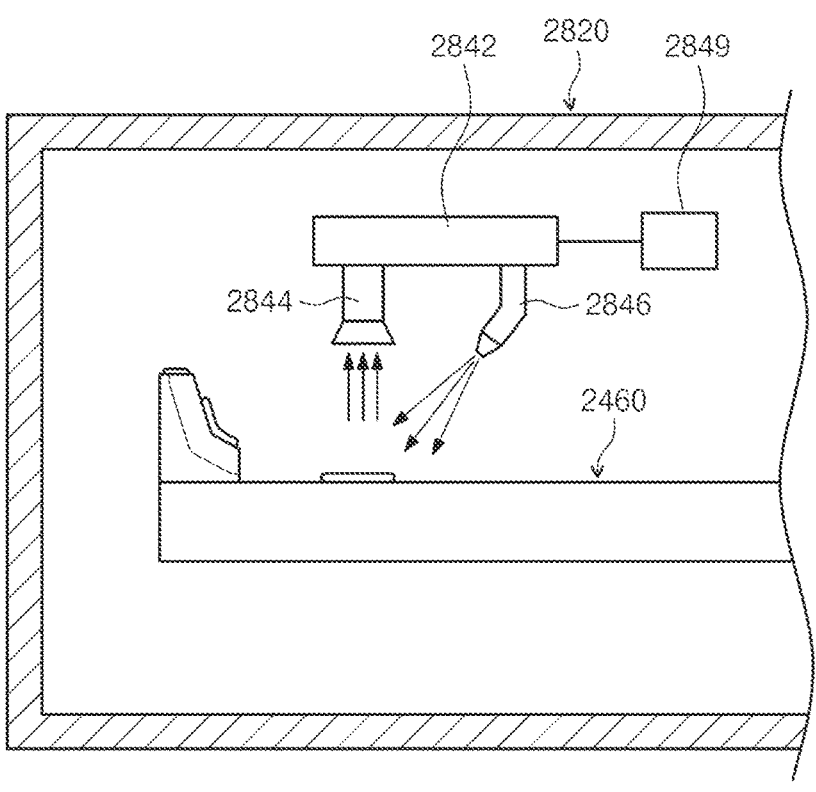
FIGS. 17 to 19 are diagrams sequentially illustrating a process in which the cleaning member of FIG. 16 cleans the hand of the main transfer robot.
Figure 18:
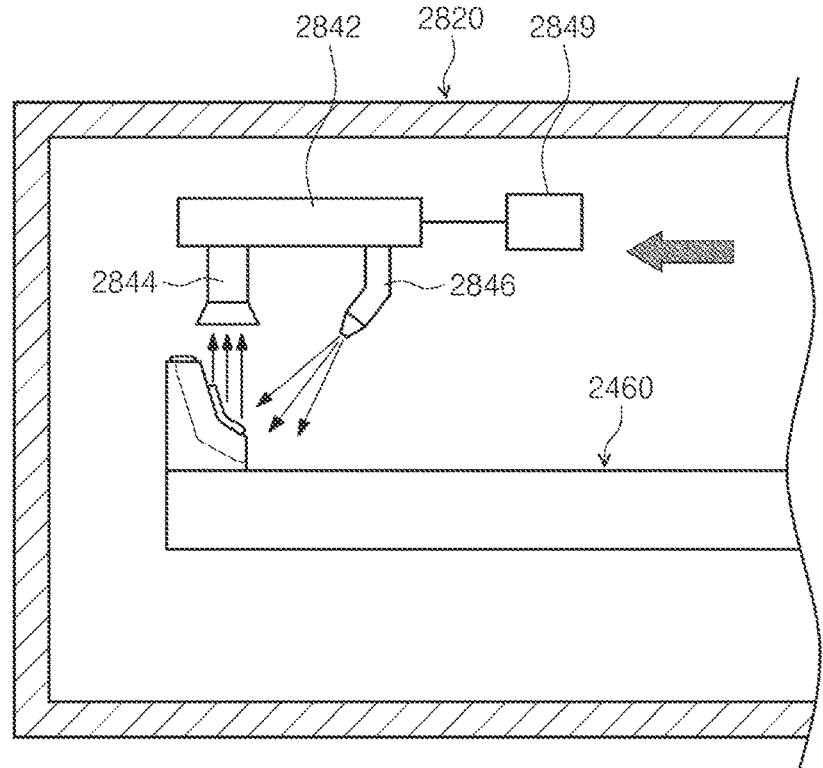
Figure 19:
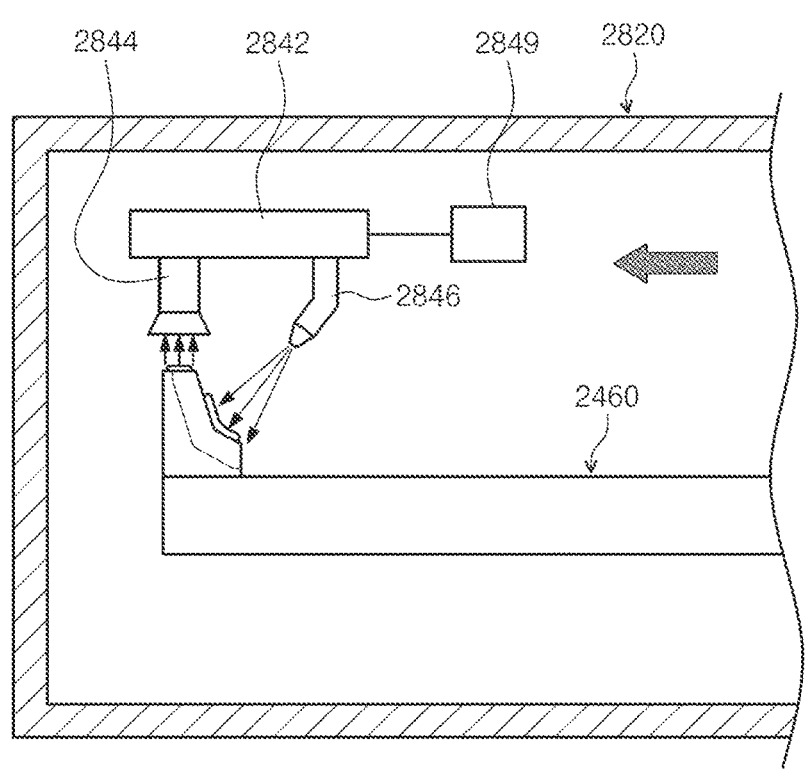

FIGS. 17 to 19 are diagrams sequentially illustrating a process in which the cleaning member 2840 of FIG. 16 cleans the hand 2460 of the main transfer robot 2420. Referring to FIG. 17, the suction member 2844 sucks foreign substances or moisture in the hand 2460 of the main transfer robot 2420. The purge nozzle 2846 injects the purge gas toward the hand 2460 of the main transfer robot 2420. Referring to FIG. 11, the support 2842 is horizontally moved by the first driver 2849 toward the guides 2466a, 2466b, 2468a, and 2468b of the main transfer robot 2420. The cleaning member 2840 continuously cleans while the support 2842 is moving. Referring to FIG. 12, the cleaning member 2840 moves in the horizontal direction even after the suction member 2844 cleans the guides 2466a, 2466b, 2468a, and 2468b. The purge nozzle 2846 continuously injects the purge gas toward the guides 2466a, 2466b, 2468a, and 2468b. In this case, residual foreign substances or moisture is removed with the injected purge gas.

A plurality of cleaning members 2840 may be provided. When one cleaning member 2840 horizontally moves toward the first guides 2466a and 2466b, the other cleaning member 2840 may horizontally move toward the second guides 2468a and 2468b. Each cleaning member 2840 may move simultaneously or separately.

Figure 20:
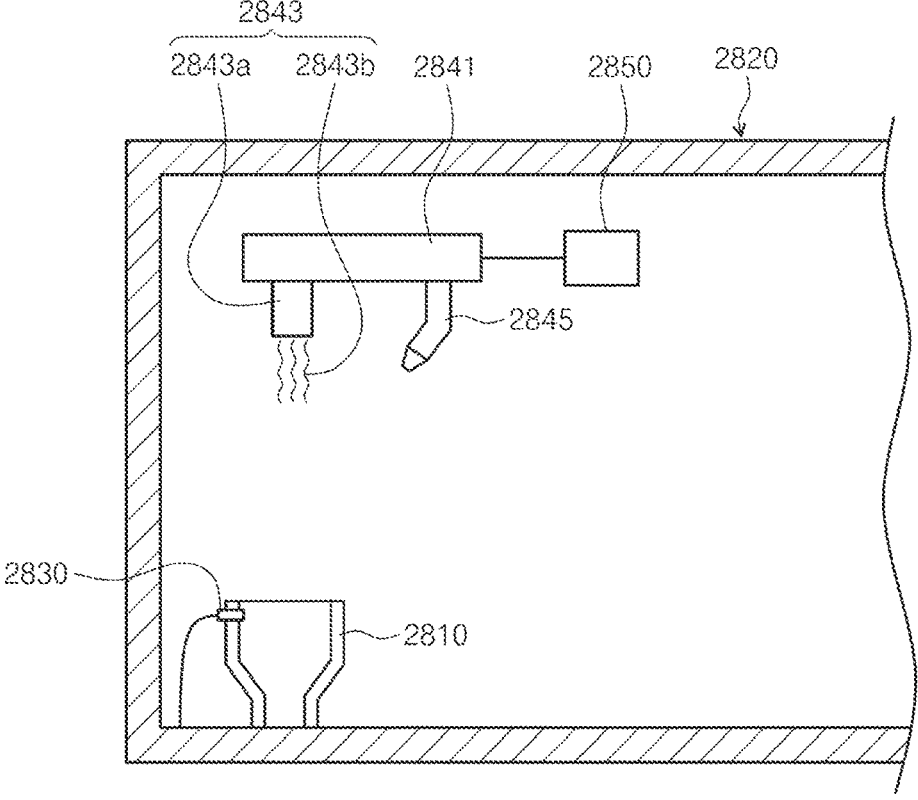
FIG. 20 is a cross-sectional view schematically illustrating another exemplary embodiment of the cleaning member of FIG. 8.

FIG. 20 is a cross-sectional view schematically illustrating another exemplary embodiment of the cleaning member 2840 of FIG. 8. Referring to FIG. 20, the cleaning unit 2800 includes a housing 2820, a cleaning member 2840, and a brush cleaning mechanism.

The cleaning member 2840 cleans the hand 2460 of the main transfer robot 2420. The cleaning member 2840 includes a support 2841, a brush 2843, a purge nozzle 2845, and a second driver 2850. The support 2841 supports the brush 2843 and the purge nozzle 2845. The support 2841 is provided so that a longitudinal direction thereof is parallel to the ground. The support 2841 may be provided in a bar shape. The support 2841 is connected to the second driver 2850.

The brush 2843 wipes off foreign substances or moisture remaining on the hand 2460 of the main transfer robot 2420. The brush 2843 includes a brush body 2843a and bristles 2843b. The brush body 2843a fixes the bristles 2843b. The brush body 2843a may be provided in a cylindrical shape. In this case, the brush body 2843a may rotate based on a central axis in the vertical direction. The bristles 2843b are installed on the bottom surface of the brush body 2843a. The bristles 2843b wipe off foreign substances or moisture remaining on the hand 2460. The bristles 2843b are provided while a plurality of bristles is fixed to the brush body 2843a.

The purge nozzle 2845 injects purge gas toward the hand 2460 of the main transfer robot 2420. The purge nozzle 2845 is installed on the support 2841. An upper portion of the purge nozzle 2845 is provided perpendicular to the ground, and a lower portion of the purge nozzle 2845 is inclined toward the guides 2466a, 2466b, 2468a, and 2468b of the main transfer robot 2420. A supply line for supplying purge gas to the purge nozzle 2845 may be formed in the support 2841.

The second driver 2850 moves the support 2841 in a direction parallel to the hand 2460 loaded into the housing. The support 2841 may be moved along the fingers 2464a and 2464b of the hand 2460 of the main transfer robot 2420. The second driver 2850 may move the support 2841 in a vertical downward direction.

The brush cleaning mechanism includes a cup 2810 and a cleaning nozzle 2830. The cup 2810 prevents the discharge of foreign substances while the bristles 2843b of the brush are cleaned. The cup 2810 is installed under the cleaning unit 2800. Also, the cup 2810 may be positioned below the front or rear ends of the fingers 2464a and 2464b of the hand of the transfer robot. The cup 2810 is provided in a shape surrounding the bristles 2843b of the brush. The cup 2810 has an inner space with an open top. Foreign substances or moisture in the inner space of the cup 2810 are discharged to the outside of the cup 2810 through the discharge line.

The cleaning nozzle 2830 injects a liquid to clean the bristles 2843b of the brush. The cleaning nozzle 2830 may be provided in the form of an annular tube. The cleaning nozzle 2830 may be formed on an upper side surface of the cup 2810. In a state in which the transfer robot 2420 is removed from the cleaning unit 2800, the brush 2843 descends and is contained in the cup 2810. After the brush 2843 is contained in the cup 2810, the cleaning nozzle 2830 injects DIW toward the bristles 2843b.

The cup 2810 may be provided in a state filled with water. The water may be deionized water (DIW). The bristles 2843b of the brush are removed from cup 2810 after being cleaned by DIW. After cleaning, the DIW is discharged to the outside of the cup 2810 through the discharge line.

A plurality of cleaning members may be provided. When one cleaning member 2840 horizontally moves toward the first guides 2466a and 2466b, the other cleaning member 2840 may horizontally move toward the second guides 2468a and 2468b. Each cleaning member 2840 may move simultaneously or separately.

Figure 21:
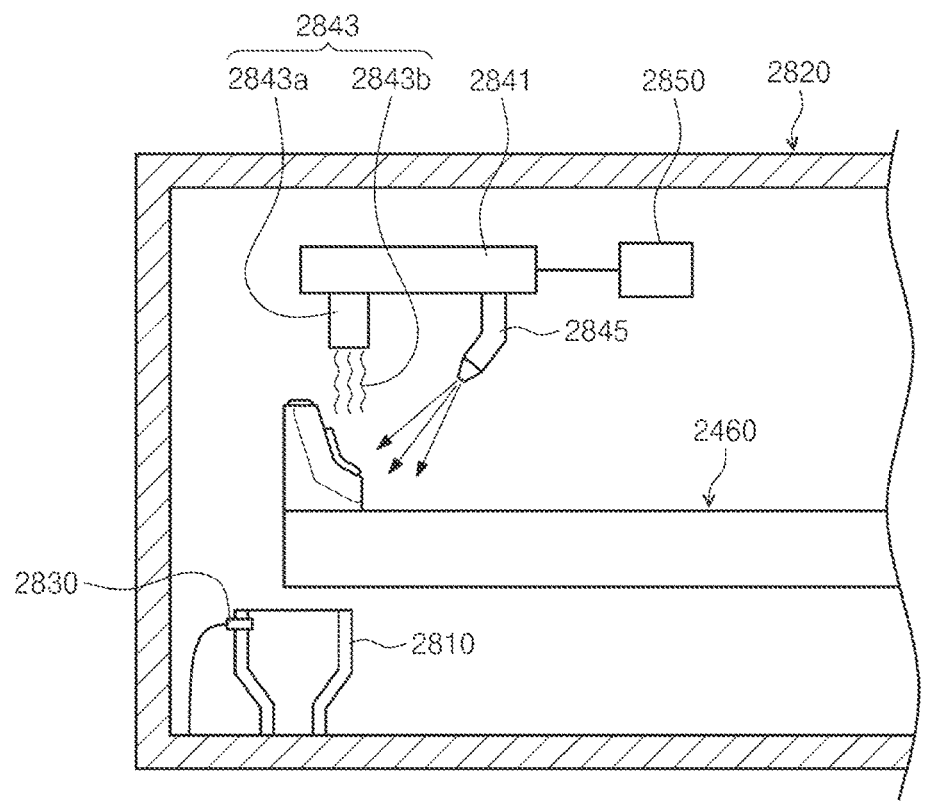
FIGS. 21 and 22 are diagrams sequentially illustrating a process in which the cleaning member of FIG. 20 cleans the hand of the main transfer robot.
Figure 22:
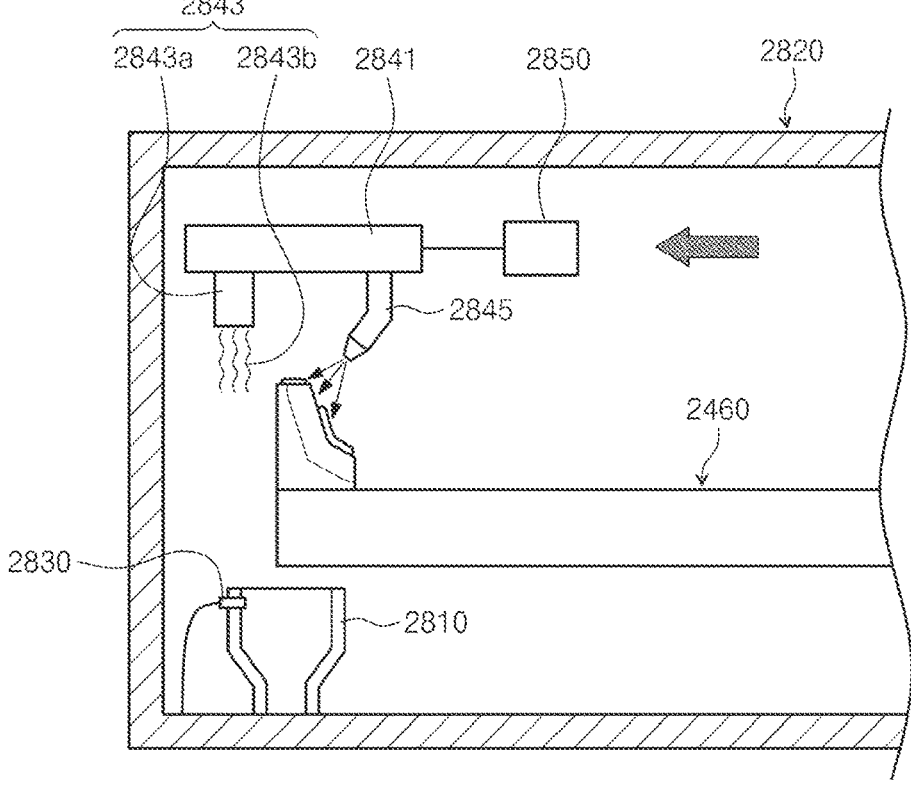

FIGS. 21 and 22 are diagrams sequentially illustrating a process in which the cleaning member 2840 of FIG. 20 cleans the hand 2460 of the main transfer robot 2420. Referring to FIG. 21, the brush 2843 wipes off foreign substances or moisture in the hand 2460 of the main transfer robot 2420. The purge nozzle 2845 injects purge gas toward the hand 2460 of the main transfer robot 2420. Referring to FIG. 22, the support 2841 is horizontally moved by the second driver 2850 toward the guides 2466a, 2466b, 2468a, and 2468b of the main transfer robot 2420. The cleaning member 2840 continuously cleans while the support 2841 is moving. In this case, residual foreign substances or moisture is removed with the injected purge gas.

Figure 23:
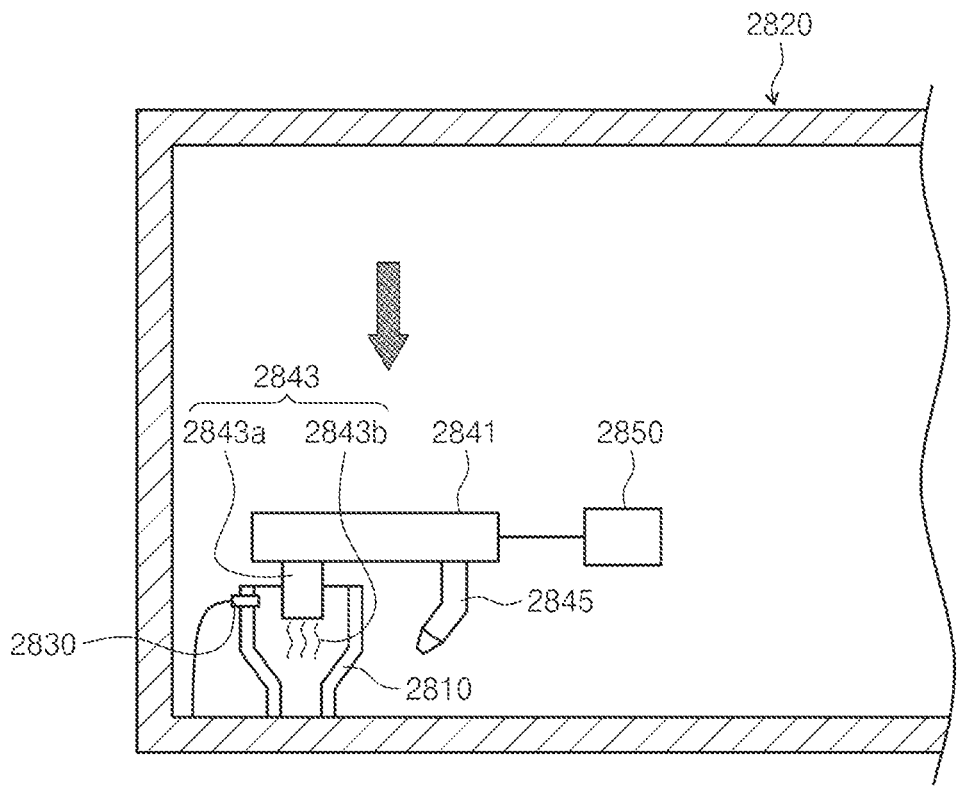
FIG. 23 is a diagram illustrating cleaning of a brush of the cleaning member of FIG. 20.

FIG. 23 is a diagram illustrating cleaning of the brush 2843 of the cleaning member of FIG. 13. Referring to FIG. 23, the hand 2460 of the main transfer robot 2420 that has been cleaned is removed from the cleaning unit 2800. After the hand 2460 is removed, the cleaning member 2840 descends toward the cup 2810 located at the bottom of the cleaning unit 2800. The cleaning member 2840 descends until the bristles 2843b of the brush are located into the cup 2810. The cleaning nozzle 2830 injects DIW toward the bristles 2843b. Foreign substances or moisture scattered from the bristles 2843b are discharged to the outside of the cup 2810 through the discharge line.

Figure 24:
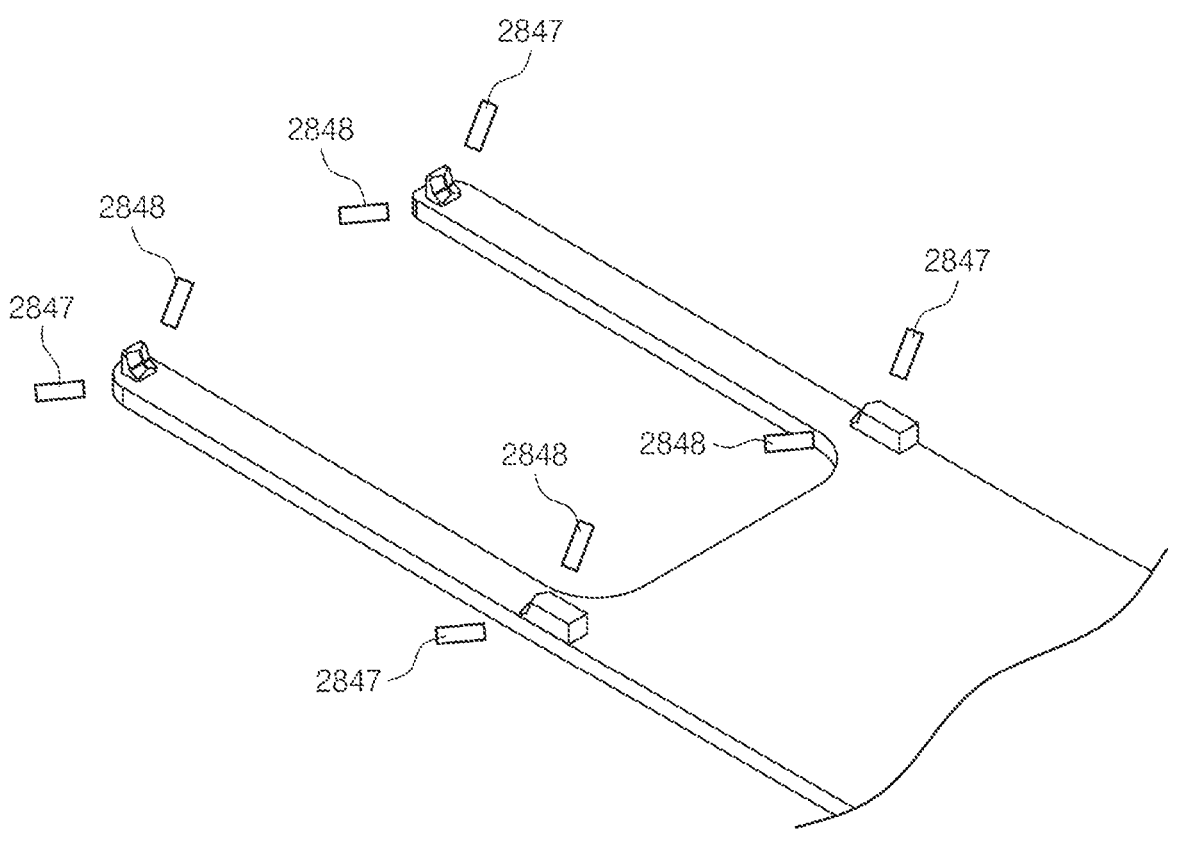
FIG. 24 is a diagram schematically illustrating another exemplary embodiment of the cleaning member of FIG. 8.

FIG. 24 is a diagram schematically illustrating another exemplary embodiment of the cleaning member 2840 of FIG. 8. Referring to FIG. 24, the cleaning member 2840 includes a suction pipe 2847 and a purge nozzle 2848.

The suction pipe 2847 sucks foreign substances or moisture from the hand 2460 of the main transfer robot. The suction tube 2847 may be provided in the form of an annular tube. The suction pipe 2847 is disposed above the cleaning unit 2800. The purge nozzle 2848 injects the purge gas toward the hand 2460 of the main transfer robot. The purge nozzle 2848 is disposed on top of the cleaning unit 2800. The purge nozzles 2848 are installed to face each other with the fingers interposed therebetween. One or a plurality of suction pipes 2847 and purge nozzles 2848 may be provided.

Unlike the above description, the cleaning member 2840 may include a suction member, a horizontal driver, and a vertical driver. The cleaning member may consist of a purge nozzle, a horizontal driver, and a vertical driver. The cleaning member may consist of a brush, a horizontal driver, and a vertical driver.

Figure 25:
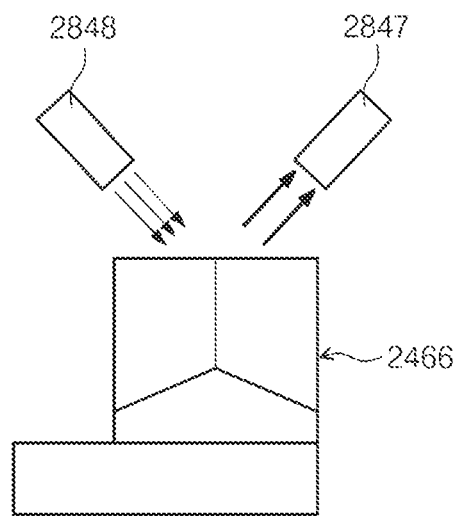
FIG. 25 is a cross-sectional view illustrating a state in which the hand of the main transfer robot is cleaned by using the cleaning member of FIG. 24.

FIG. 25 is a cross-sectional view illustrating a state in which the hand 2460 of the main transfer robot 2420 is cleaned by using the cleaning member 2840 of FIG. 24. Referring to FIG. 25, the purge nozzle 2848 injects the purge gas toward the guides 2466a, 2466b, 2468a, and 2468b of the main transfer robot. The suction pipe 2847 sucks foreign substances or moisture scattered from the guides 2466a, 2466b, 2468a, and 2468b of the main transfer robot while the purge nozzle 2848 injects the purge gas. It has the effect of shortening the cleaning time when foreign substances, moisture, and other scattered substances are cleaned.

Figure 26:
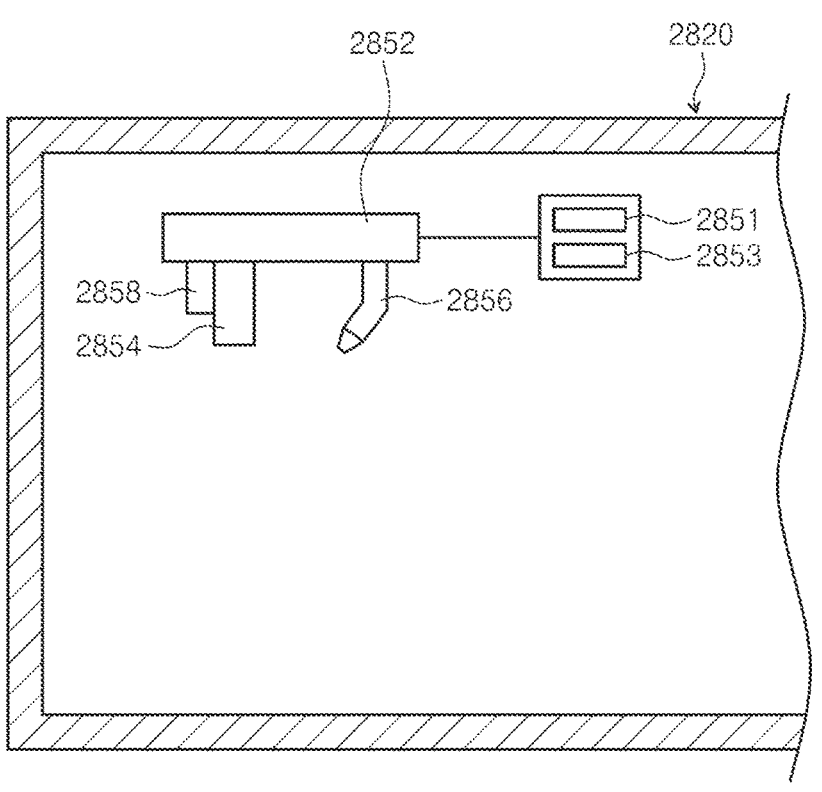
FIG. 26 is a cross-sectional view schematically illustrating another exemplary embodiment of the cleaning member of FIG. 8.

FIG. 26 is a cross-sectional view schematically illustrating another exemplary embodiment of the cleaning member 2840 of FIG. 8. Referring to FIG. 26, the cleaning member 2840 includes a support 2852, a suction member 2854, a purge nozzle 2856, a displacement sensor 2858, a horizontal driver 2851, and a vertical driver 2853.

The support 2852 supports the suction member 2854, the purge nozzle 2856, and the displacement sensor 2858. The support 2852 is provided so that a longitudinal direction thereof is parallel to the ground. The support 2852 may be provided in a bar shape. The support 2852 is connected to the horizontal driver 2851 and the vertical driver 2853.

The suction member 2854 sucks foreign substances or moisture in the hand 2460 of the main transfer robot. The suction member 2854 is provided in the form of an annular tube, and is installed on the support 2852. The suction member 2854 is disposed so that a suction port thereof faces the hand 2460 of the main transfer robot 2420 loaded into the housing.

The purge nozzle 2856 injects purge gas toward the hand 2460 of the main transfer robot 2420. The purge nozzle 2856 is installed on the support 2852. An upper portion of the purge nozzle 2856 is provided perpendicular to the ground, and a lower portion of the purge nozzle 2856 is inclined toward the guides 2466a, 2466b, 2468a, and 2468b of the main transfer robot 2420. A supply line for supplying purge gas to the purge nozzle 2856 may be formed in the support 2852.

The displacement sensor 2858 measures the height of the upper surface of the hand 2460. The displacement sensor 2858 is installed on the support 2852. Displacement sensor 2858 may be positioned adjacent to the suction member 2854 or the purge nozzle 2856. The displacement sensor 2858 continuously measures the distance to the hand while the support 2852 is horizontally moved by the horizontal driver 2851.

The horizontal driver 2851 moves the support 2852 in a direction parallel to the hand 2460 loaded into the housing. The support 2852 may be moved along the fingers 2464a and 2464b of the hand 2460 of the main transfer robot hand.

The vertical driver 2853 moves the support 2852 in a direction perpendicular to the hand 2460 loaded into the housing. The second driver 2853 adjusts the height of the support 2852 to which the cleaning member 2840 is connected during horizontal movement based on the value measured by the displacement sensor 2858.

Figure 27:
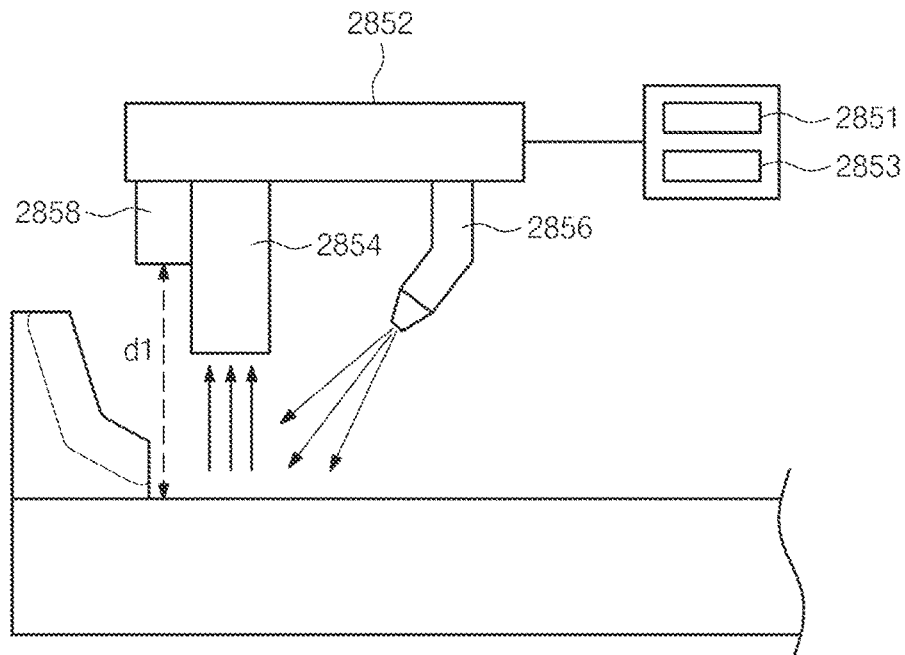
FIGS. 27 to 29 are diagrams sequentially illustrating a process of cleaning the hand of the transfer robot by using the cleaning member of FIG. 26.
Figure 28:
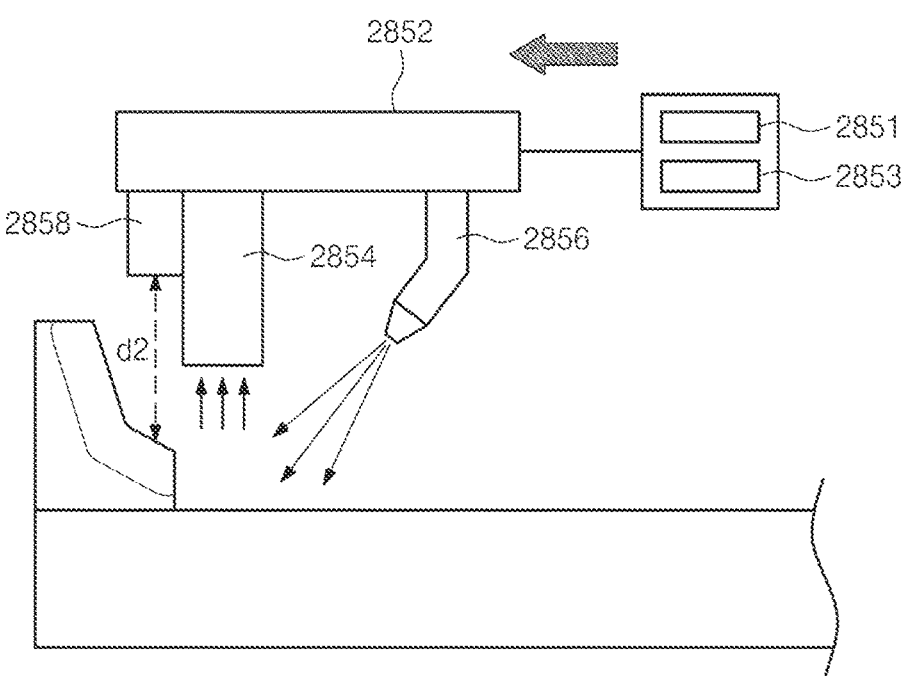
Figure 29:
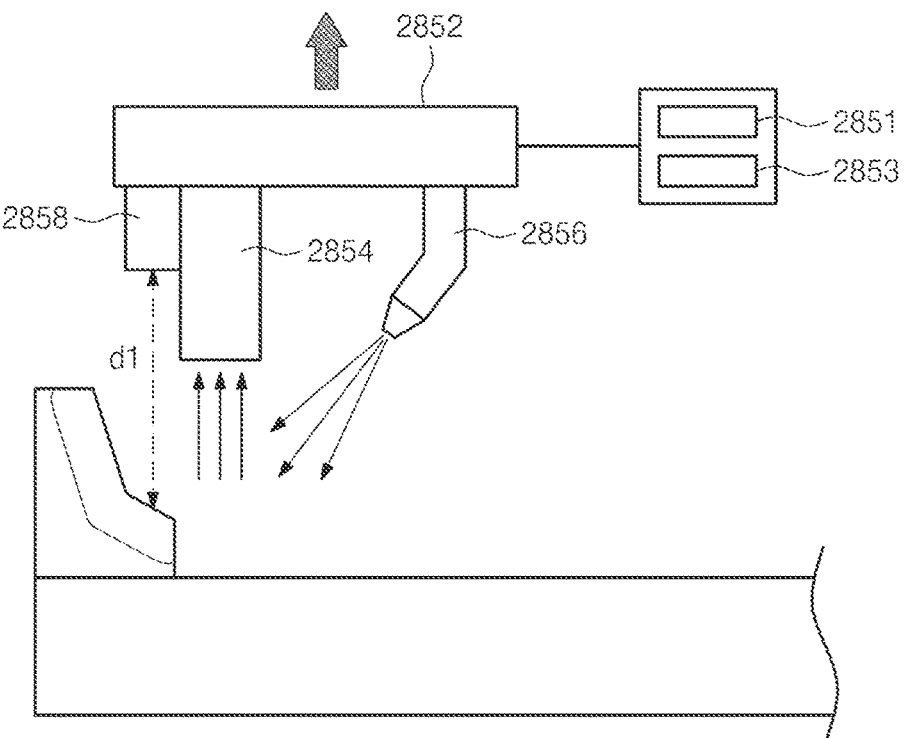

FIGS. 27 to 29 are diagrams sequentially illustrating a process of cleaning the hand of the transfer robot by using the cleaning member of FIG. 26. Referring to FIG. 27, the displacement sensor 2858 measures the height from the upper surface of the hand 2460 of the main transfer robot 2420 to the displacement sensor 2858. In this case, the height measured by the displacement sensor is referred to as d1. Referring to FIG. 28, the displacement sensor 2858 continuously measures the height from the upper surface of the hand 2460 to the displacement sensor 2858 while the support 2852 moves in the horizontal direction. The height measured after movement is called d2. Referring to FIG. 29, the support 2852 rises in the vertical direction by the vertical driver 2853 according to the (d1−d2) value. When the height measured by the displacement sensor 2858 becomes d1, the rising by the vertical driver 2853 stops. That is, when the (d1−d2) value is 0, the support 2852 moves in the horizontal direction, and when the (d1−d2) value is a positive value, the support 2852 rises vertically according to the difference value and then moves again in the horizontal direction.

The structure of the cleaning member of FIG. 26 may also be equally applied to the structures of the cleaning member of FIGS. 16 and 20. Accordingly, a process of moving the cleaning member according to the value measured by the displacement sensor may be equally applied.

Figure 30:
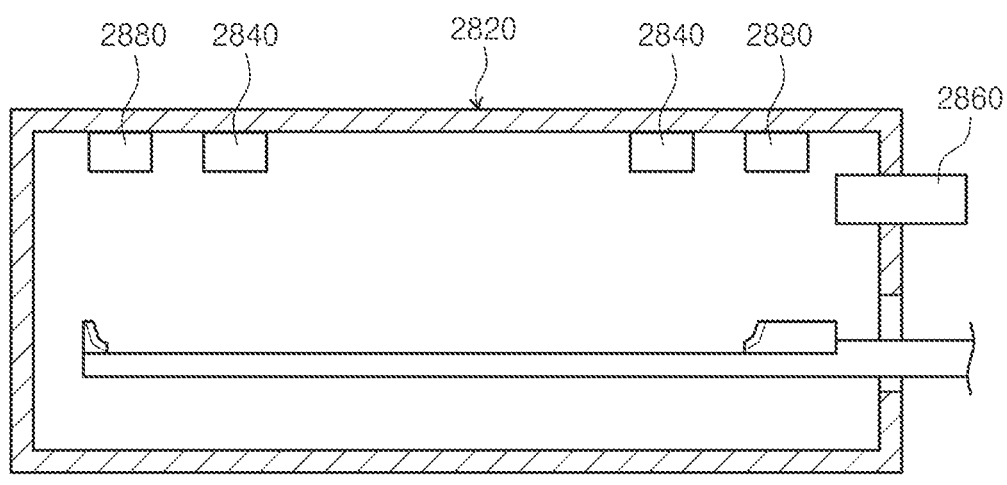
FIG. 30 is a cross-sectional view schematically illustrating another exemplary embodiment of the cleaning unit of FIG. 8.

FIG. 30 is a cross-sectional view schematically illustrating another exemplary embodiment of the cleaning unit of FIG. 8. Referring to FIG. 30, a detection member 2880 measures the degree of contamination of the hand 2460 of the main transfer robot. The detection member 2880 may be located on the upper surface of the housing to measure whether the upper portion of the hand 2460 is contaminated. The detection member 2880 may be configured as a camera or a sensor capable of observing an image. Whether to clean is determined according to the degree of contamination measured or observed by the detection member 2880. Unlike the above, whether to clean may be determined according to the number of substrates treated in the substrate treating apparatus. According to another example, whether to clean may be determined according to a predetermined period.

Figure 31:
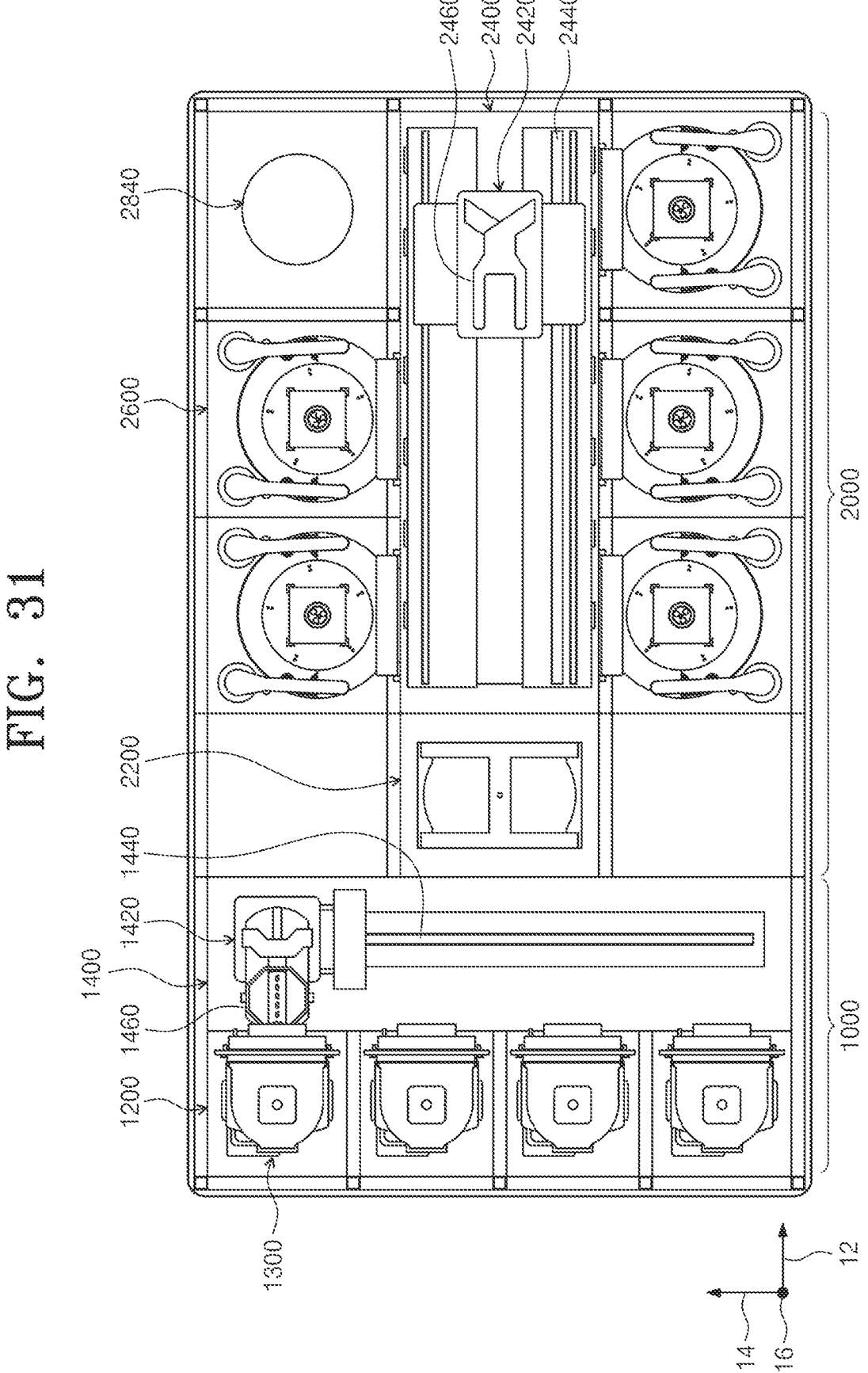
FIGS. 31 and 32 are top plan views illustrating other examples of the substrate treating apparatus of FIG. 1, respectively.
Figure 32:
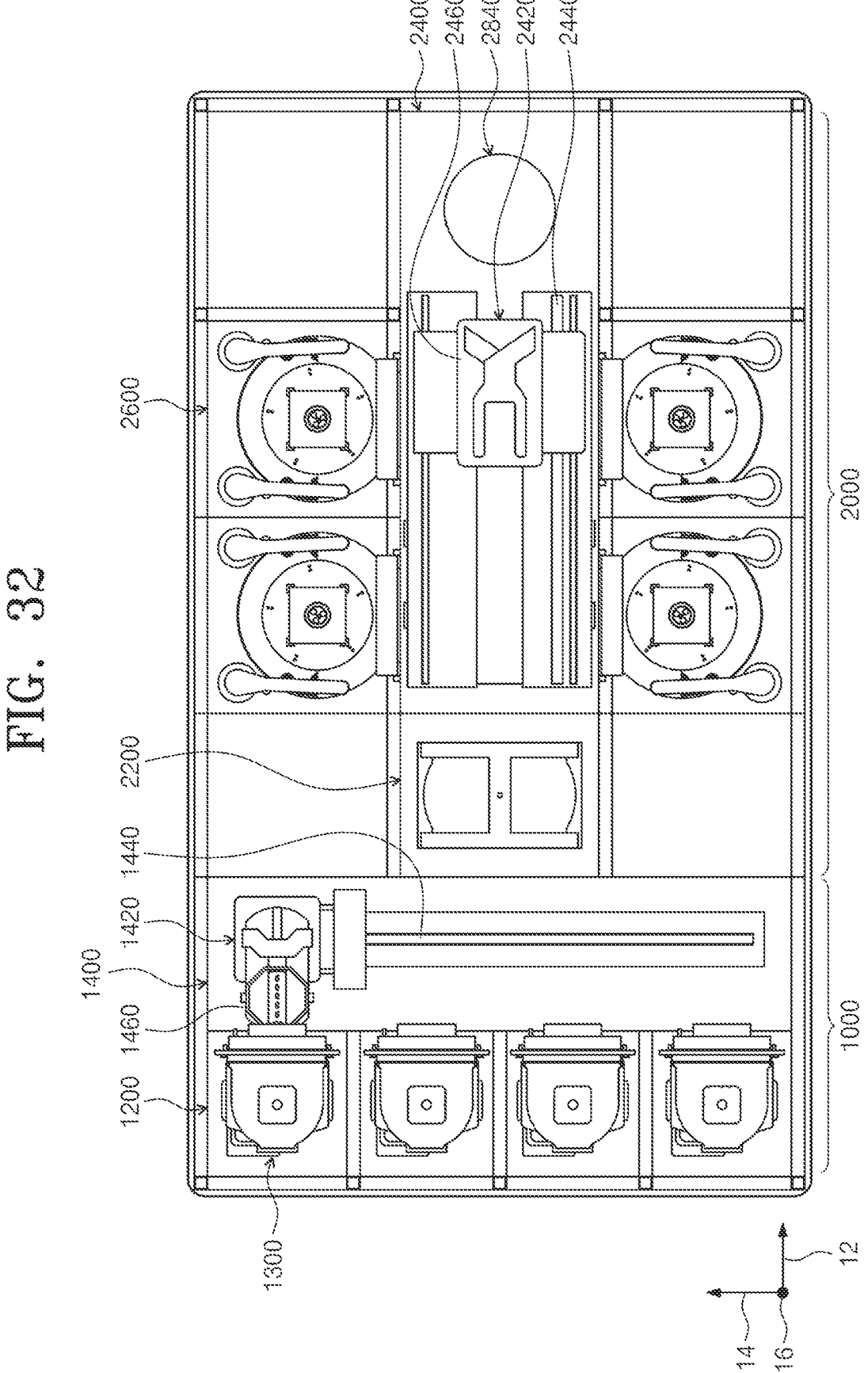

In the above-described example, it has been described that the cleaning unit 2800 is stacked with the buffer module 2200. Alternatively, however, the cleaning unit 2800 may be disposed within the treating module 2200. For example, as illustrated in FIG. 31, the process chamber 2600 and the cleaning unit 2800 may be arranged along the first direction 12. Optionally, as illustrated in FIG. 32, the cleaning unit 2800 may be disposed on the opposite side to the buffer module 2200 with respect to the transfer chamber 2400.

Figure 33:
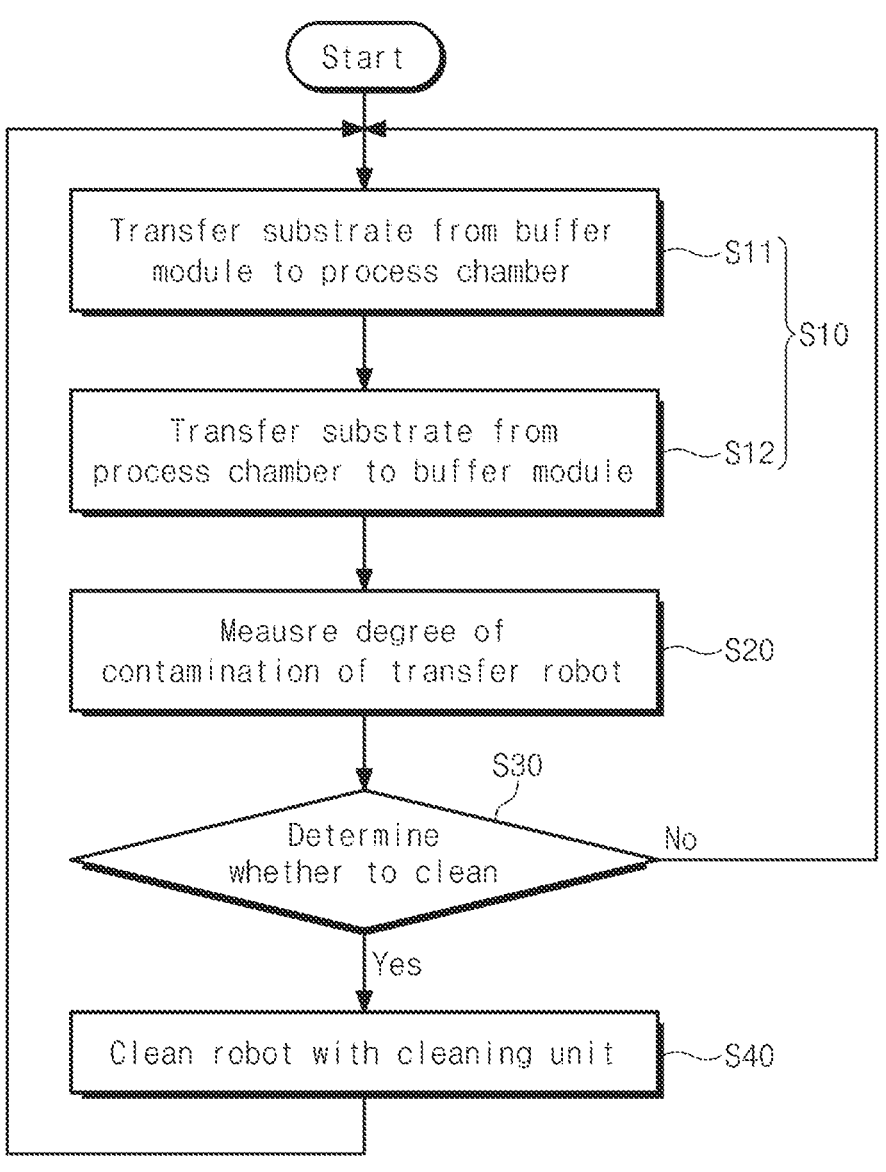
FIG. 33 is a flowchart illustrating a method of cleaning the hand of the main transfer robot in the substrate treating apparatus of FIG. 1.

FIG. 33 is a flowchart illustrating a method of cleaning a robot according to an exemplary embodiment of the present invention. The method of cleaning the robot includes a substrate transfer operation (S10), a contamination degree measurement operation (S20), a cleaning determination operation (S30), and a robot cleaning operation (S40).

The substrate transfer operation (S10) consists of transferring the substrate from the buffer module 2200 to the process chamber 2600 (S11) and transferring the substrate from the process chamber 2600 to the buffer module 2200 (S12). After the main transfer robot 2420 transfers the substrate from the buffer module 2200 to the process chamber 2600, a cleaning process is performed in the process chamber 2600. After the process is performed, the main transfer robot 2420 transfers the substrate from the process chamber 2600 to the buffer module 2200.

After the substrate transfer operation in the transfer robot contamination degree measurement operation S20, the degree of contamination of the upper portion of the hand 2460 is measured through the detection member 2880. After the main transfer robot 2420 enters the inlet of the cleaning unit 2800, the degree of contamination is measured. The measurement of the degree of contamination is performed in the state where the substrate is removed.

The cleaning determination operation (S30) is an operation of determining whether to clean according to the measured degree of contamination. Whether to clean is determined by comparing a pre-set condition and the degree of contamination. When the degree of contamination is lower than the set condition, the main transfer robot 2420 proceeds to transfer the substrate after being unloaded from the cleaning unit 2800 (S11). When the degree of contamination is higher than the set condition, the robot cleaning operation S40 is performed through the cleaning member.

The robot cleaning operation S40 is an operation of cleaning the main transfer robot 2420 through the cleaning member 2840. After the cleaning is completed, the degree of contamination of the main transfer robot 2420 is measured again through the detection member 2880. When the degree of contamination is lower than the set condition, the main transfer robot 2420 proceeds to transfer the substrate after being unloaded from the cleaning unit 2800 (S11). When the degree of contamination is higher than the set condition, the robot cleaning operation S40 is performed again.

According to another exemplary embodiment, in the cleaning determination operation, whether to proceed cleaning may be determined according to the number of substrates that have been treated in the substrate treating apparatus. In this case, the time for the cleaning determination operation may be shortened, thereby increasing cleaning efficiency.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   an index module; and
   a treating module disposed adjacent to the index module and treating the substrate,
   wherein the treating module includes:
   one or a plurality of process chambers;
   a transfer chamber provided with a main transfer robot for transferring the substrate to the process chamber; and
   a cleaning unit for cleaning a hand of the main transfer robot, the cleaning unit including a housing, and a liquid receiving plate disposed below a purge nozzle,
   wherein the cleaning unit further includes an exhaust member for exhausting an inside of the housing,
   when viewed from the top, an exhaust pipe of the exhaust member is coupled to the housing at a position lower than the liquid receiving plate so as to overlap the liquid receiving plate,
   wherein an upper surface of the liquid receiving plate is concave to stably retain liquid dripping from the hand of the main transfer robot during cleaning thereof, such that the liquid is held on the upper surface of the liquid receiving plate during cleaning of the hand, and
   wherein the liquid receiving plate prevents the liquid falling from the hand from flowing into an exhaust port of the exhaust pipe during cleaning of the hand.

2. The apparatus of claim 1, wherein the purge nozzle is disposed in the housing and cleans the hand of the main transfer robot loaded into the housing.

3. The apparatus of claim 2, wherein the purge nozzle for discharging purge gas to an upper surface of the hand of the main transfer robot loaded into the housing.

4. The apparatus of claim 2, wherein the purge nozzle has a plurality of discharge ports for discharging purge gas in a downward direction, and
   the hand of the main transfer robot includes:
   a base plate; and
   a guide on which the substrate is placed and which is disposed so as to protrude from the base plate in an upper direction, and
   when the hand of the main transfer robot is loaded into and unloaded from the housing by forward and backward movement, a longitudinal direction of the purge nozzle is provided in a direction perpendicular to the forward and backward movement direction of the hand when viewed from the top.

5. The apparatus of claim 4, wherein the base plate includes:
   a body; and
   a pair of fingers extending from the body,
   the guide includes:
   a first guide installed at a front end of each of the pair of fingers; and
   a second guide installed at a rear end of each of the pair of fingers; and
   the plurality of discharge ports includes a plurality of first holes disposed in a first region opposite to the finger in a state in which the hand of the main transfer robot is loaded into the housing when viewed from above.

6. The apparatus of claim 5, wherein the plurality of discharge ports further includes a plurality of second holes disposed in a second region opposite to a space between the fingers in a state in which the hand of the main transfer robot is loaded into the housing when viewed from above, and
   the first holes in the first region are formed at a higher density than the second holes in the second region.

7. The apparatus of claim 4, wherein the cleaning member further includes an auxiliary nozzle provided with a second plurality of discharge ports for discharging purge gas, and
   a longitudinal direction of the auxiliary nozzle is provided in a vertical direction,
   wherein a lower end of the auxiliary nozzle is positioned lower than the hand, and an upper end of the auxiliary nozzle is positioned higher than the hand.

8. The apparatus of claim 7, wherein the second plurality of discharge ports are configured to discharge the purge gas in a lateral direction.

9. The apparatus of claim 2, wherein the cleaning unit is installed adjacent to the transfer chamber.

10. The apparatus of claim 2, wherein the cleaning unit is positioned between the index module and the transfer chamber.

11. The apparatus of claim 2, wherein the treating module further includes a buffer module disposed between the index module and the transfer chamber to temporarily store the substrate transferred between the index module and the transfer chamber, and the cleaning unit is installed to be stacked with the buffer module.

12. The apparatus of claim 1, wherein the liquid receiving plate is disposed at a position lower than the hand of the main transfer robot and higher than a bottom surface of the housing, and wherein the liquid receiving plate is spaced apart from the bottom surface of the housing by a plurality of support rods.

13. An apparatus for treating a substrate, the apparatus comprising:

an index module; and a treating module disposed adjacent to the index module and treating the substrate, wherein the treating module includes:

one or a plurality of process chambers;

a transfer chamber provided with a main transfer robot for transferring the substrate to the process chamber;

a cleaning unit for cleaning the main transfer robot; and a buffer module disposed between the index module and the transfer chamber to temporarily store the substrate transferred between the index module and the transfer chamber, and a hand of the main transfer robot includes:

a base plate; and a guide on which the substrate is placed and which is disposed so as to protrude from the base plate in an upper direction, and the cleaning unit is installed to be stacked with the buffer module, and includes:

a housing; and a cleaning member which is provided in the housing and cleans the hand of the main transfer robot, the cleaning member is provided to clean foreign substances or moisture scattered from the guide of the hand of the main transfer robot, and the cleaning unit including a liquid receiving plate disposed below a purge nozzle in the housing for discharging purge gas to an upper surface of the hand of the main transfer robot loaded into the housing, wherein the cleaning unit further includes an exhaust member for exhausting an inside of the housing, when viewed from the top, an exhaust pipe of the exhaust member is coupled to the housing at a position lower than the liquid receiving plate so as to overlap the liquid receiving plate, wherein an upper surface of the liquid receiving plate is concave to stably retain liquid dripping from the hand of the main transfer robot during cleaning of the hand, such that the liquid is held on the upper surface of the liquid receiving plate during cleaning of the hand, and wherein the liquid receiving plate prevents the liquid falling from the hand from flowing into an exhaust port of the exhaust pipe during cleaning of the hand.

\* \* \* \* \*